United States Patent
Kang et al.

(10) Patent No.: US 12,431,183 B2
(45) Date of Patent: Sep. 30, 2025

(54) SEMICONDUCTOR MEMORY DEVICE AND MEMORY SYSTEM

(71) Applicant: SAMSUNG ELECTRONICS CO., LTD., Suwon-si (KR)

(72) Inventors: Sang Kyu Kang, Anyang-si (KR); Jieun Shin, Seongnam-si (KR); Hocheol Bang, Hwaseong-si (KR); Haewon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

(21) Appl. No.: 18/529,673

(22) Filed: Dec. 5, 2023

(65) Prior Publication Data

US 2024/0105250 A1    Mar. 28, 2024

Related U.S. Application Data

(63) Continuation of application No. 17/659,475, filed on Apr. 15, 2022, now Pat. No. 11,869,569.

(30) Foreign Application Priority Data

Sep. 10, 2021    (KR) .................. 10-2021-0121127

(51) Int. Cl.
  *G11C 11/406*    (2006.01)
  *G11C 7/10*    (2006.01)
  (Continued)

(52) U.S. Cl.
  CPC ...... *G11C 11/40615* (2013.01); *G11C 7/1063* (2013.01); *G11C 7/109* (2013.01);
  (Continued)

(58) Field of Classification Search
  CPC ................. G11C 11/40615; G11C 11/406
  (Continued)

(56) References Cited

U.S. PATENT DOCUMENTS 5,963,474 A * 10/1999 Uno .............. G11C 29/765
                                              365/185.11
7,523,013 B2    4/2009 Gorobets et al.
(Continued)

FOREIGN PATENT DOCUMENTS

JP    2010244521 A    10/2010
JP    2017-084341 A    7/2017
(Continued)

OTHER PUBLICATIONS

Notice of Allowance dated May 14, 2025 issued in corresponding Korean Patent Application No. 10-2021-0121127.

*Primary Examiner* — Muna A Techane

(74) *Attorney, Agent, or Firm* — Morgan, Lewis & Bockius LLP

(57) ABSTRACT

A semiconductor memory device includes a memory cell array including a plurality of memory cells and a control logic circuit configured to control the semiconductor memory device. The control logic circuit includes a mode register and a remaining lifetime calculating device configured to count usage metrics based on one or more of the following: a number of clock signals received from a memory controller, an amount of data transmitted or received to or from the memory controller, and/or a number of commands received from the memory controller. The remaining lifetime calculating device generates a remaining lifetime code representing a remaining lifetime of the semiconductor memory device based on the usage metrics, and stores the remaining lifetime code in the mode register.

20 Claims, 21 Drawing Sheets

(51) Int. Cl.
  *G11C 11/4076* (2006.01)
  *G11C 16/34* (2006.01)
(52) U.S. Cl.
  CPC .... *G11C 11/40622* (2013.01); *G11C 11/4076* (2013.01); *G11C 16/3495* (2013.01); *G06F 2212/1036* (2013.01)
(58) Field of Classification Search
  USPC ........................................................ 365/222
  See application file for complete search history.

(56) References Cited

U.S. PATENT DOCUMENTS

| | | | |
|---|---|---|---|
| 7,596,656 | B2 | 9/2009 | Elhamias |
| 7,653,778 | B2 | 1/2010 | Merry, Jr. et al. |
| 7,778,077 | B2 | 8/2010 | Gorobets et al. |
| 8,166,232 | B2 | 4/2012 | Kawaguchi |
| 8,171,356 | B2 | 5/2012 | Danilak |
| 8,856,424 | B2 | 10/2014 | Yoon et al. |
| 8,862,806 | B2 | 10/2014 | Yoon et al. |
| 8,862,807 | B2 | 10/2014 | Yoon et al. |
| 9,037,778 | B2 | 5/2015 | Yoon et al. |
| 9,223,506 | B2 | 12/2015 | Yoon et al. |
| 9,348,521 | B2 | 5/2016 | Yoon et al. |
| 10,108,354 | B2 | 10/2018 | Lee et al. |
| 10,475,519 | B2 | 11/2019 | Parry et al. |
| 11,269,723 | B2 | 3/2022 | Cha et al. |
| 11,309,054 | B2 | 4/2022 | Jung et al. |
| 11,393,519 | B2 | 7/2022 | Jeong et al. |
| 2009/0138654 | A1* | 5/2009 | Sutardja ............... G11C 16/349 711/E12.008 |
| 2012/0066439 | A1* | 3/2012 | Fillingim .............. G06F 3/0653 711/E12.008 |
| 2012/0144145 | A1 | 6/2012 | Shin |
| 2017/0068467 | A1 | 3/2017 | Rothberg |
| 2020/0393506 | A1 | 12/2020 | Landman et al. |
| 2023/0081557 | A1 | 3/2023 | Kang et al. |

FOREIGN PATENT DOCUMENTS

| | | |
|---|---|---|
| KR | 10-0750568 | 8/2007 |
| KR | 10-1756130 | 7/2017 |
| KR | 10-1773700 | 8/2017 |
| KR | 10-2019-0132310 A | 11/2019 |
| KR | 10-2020-0085323 | 7/2020 |
| KR | 10-2020-0124324 A | 11/2020 |
| KR | 10-2021-0026487 A | 3/2021 |
| KR | 10-2021-0063561 A | 6/2021 |
| KR | 10-2021-0089016 A | 7/2021 |
| KR | 10-2021-0102689 A | 8/2021 |
| KR | 10-1190742 | 10/2021 |
| WO | 2019182747 A1 | 9/2019 |

\* cited by examiner

| B4 | B3 | B2 | B1 | DESCRIPTION |
|----|----|----|----|-------------|
| 0 | 0 | 0 | 0 | 100% (MAXIMUM LIFETIME) |
| 0 | 0 | 0 | 1 | 90% |
| 0 | 0 | 1 | 0 | 80% |
| ... | ... | ... | ... | ... |
| 1 | 1 | 0 | 1 | 10% |
| 1 | 1 | 1 | 0 | 5% |
| 1 | 1 | 1 | 1 | 0% (NO REMAINING LIFETIME) |

| B8 | B7 | B6 | B5 | DESCRIPTION |
|----|----|----|----|-------------|
| 0 | 0 | 0 | 0 | N/A |
| 0 | 0 | 0 | 1 | CLK |
| 0 | 0 | 1 | 0 | DQ |
| 0 | 1 | 0 | 0 | RW_CMD |
| 1 | 0 | 0 | 0 | REF_CMD |
| 0 | 0 | 1 | 1 | CLK & DQ |
| 0 | 1 | 0 | 1 | CLK & RW_CMD |
| 1 | 0 | 0 | 1 | CLK & REF_CMD |
| 0 | 1 | 1 | 0 | DQ & RW_CMD |
| 1 | 0 | 1 | 0 | DQ & REF_CMD |
| 1 | 1 | 0 | 0 | RW_CMD & REF_CMD |
| ... | ... | ... | ... | ... |
| 1 | 1 | 1 | 1 | CLK & DQ & RW_CMD & REF_CMD |

SEMICONDUCTOR MEMORY DEVICE AND MEMORY SYSTEM

CROSS-REFERENCE TO RELATED APPLICATIONS

This application is a continuation of U.S. application Ser. No. 17/659,475, filed on Apr. 15, 2022, which claims priority under 35 USC § 119 to Korean Patent Application No. 10-2021-0121127 filed on Sep. 10, 2021 in the Korean Intellectual Property Office (KIPO), the disclosures of which are incorporated by reference herein in their entirety.

TECHNICAL FIELD

Embodiments of the disclosure relate generally to semiconductor integrated circuits, and more particularly to semiconductor memory devices and memory systems.

DISCUSSION OF THE RELATED ART

Semiconductor memory devices may be classified as either volatile memory devices or nonvolatile memory devices. Volatile memory devices lose stored data when disconnected from power. Nonvolatile memory devices retain stored data when disconnected from power. A volatile memory device, such as a dynamic random access memory (DRAM), may be used as a memory storage in a computing system to store data used in the operation of programs on the computing system. For example, the volatile memory device may be used as a memory storage in a server system, a computing system for a vehicle, etc.

SUMMARY

An embodiment of the present disclosure provides a semiconductor memory device capable of calculating a remaining lifetime.

An embodiment of the present disclosure provides a memory system capable of displaying a remaining lifetime of a semiconductor memory device.

According to embodiments of the present disclosure, a semiconductor memory device includes a memory cell array including a plurality of memory cells, and a control logic circuit configured to receive a clock signal and a command from a memory controller, and to control the semiconductor memory device to transmit data stored in the memory cell array to the memory controller and/or to store the data received from the memory controller in the memory cell array. The control logic circuit includes a mode register, and a remaining lifetime calculating device configured to count usage metrics based on one or more of the following: a number of clock signals received from the memory controller, an amount of data transmitted or received to or from the memory controller, and a number of commands received from the memory controller. The remaining lifetime calculating device is further configured to generate a remaining lifetime code representing a remaining lifetime of the semiconductor memory device based on the counted number, and to store the remaining lifetime code in the mode register.

According to embodiments of the present disclosure, a memory system includes a system-on-chip including a memory controller configured to output a clock signal, a command, and to input or output data, a semiconductor memory device configured to receive the clock signal and the command from the memory controller, to transmit or receive the data to or from the memory controller, to count a number of the clock signal, the data, and/or the command, to generate a remaining lifetime code representing a remaining lifetime of the semiconductor memory device based on the counted number, and to store the remaining lifetime code in a mode register, and a display device configured to display the remaining lifetime represented by the remaining lifetime code.

According to embodiments of the present disclosure, a memory system includes a system-on-chip including a memory controller configured to output a clock signal and a command and to input or output data, a semiconductor memory device including a memory cell array including a plurality of memory cells, and a control logic circuit configured to receive the clock signal and the command from the memory controller, and to control the semiconductor memory device to transmit the data stored in the memory cell array to the memory controller or to store the data received from the memory controller in the memory cell array, and a display device. The control logic circuit includes a mode register, a clock monitor configured to count a clock number of the clock signal received from the memory controller, a data counter configured to count a data number of the data transmitted or received to or from the memory controller, a command counter configured to count a read and write command number of read and write commands received from the memory controller, and to count a refresh command number of refresh commands received from the memory controller, an accumulator configured to calculate an accumulated clock number by accumulating the clock number, to calculate an accumulated data number by accumulating the data number, to calculate an accumulated read and write command number by accumulating the read and write command number, and to calculate an accumulated refresh command number by accumulating the refresh command number, and a remaining lifetime code generator configured to calculate a remaining clock number by subtracting the accumulated clock number from a maximum clock number corresponding to a maximum lifetime of the semiconductor memory device, to calculate a remaining data number by subtracting the accumulated data number from a maximum data number corresponding to the maximum lifetime, to calculate a remaining read and write command number by subtracting the accumulated read and write command number from a maximum read and write command number corresponding to the maximum lifetime, to calculate a remaining refresh command number by subtracting the accumulated refresh command number from a maximum refresh command number corresponding to the maximum lifetime, and to generate the remaining lifetime code based on the remaining clock number, the remaining data number, the remaining read and write command number, and/or the remaining refresh command number. The memory controller receives the remaining lifetime code stored in the mode register from the semiconductor memory device by performing a mode register read operation. The system-on-chip transfers image data for the remaining lifetime represented by the remaining lifetime code to the display device. The display device displays the remaining lifetime of the semiconductor memory device based on the image data.

As described above, a semiconductor memory device and a memory system according to embodiments of the present disclosure may predict or calculate a remaining lifetime of the semiconductor memory device by counting a clock signal, data, and/or a command. Accordingly, the remaining lifetime of the semiconductor memory device may be checked in real time, and a system error caused by lifetime exhaustion can be prevented.

BRIEF DESCRIPTION OF THE DRAWINGS

Illustrative, non-limiting embodiments of the disclosure will be more clearly understood from the following detailed description taken in conjunction with the accompanying drawings.

DETAILED DESCRIPTION OF THE EMBODIMENTS

Figure 1:
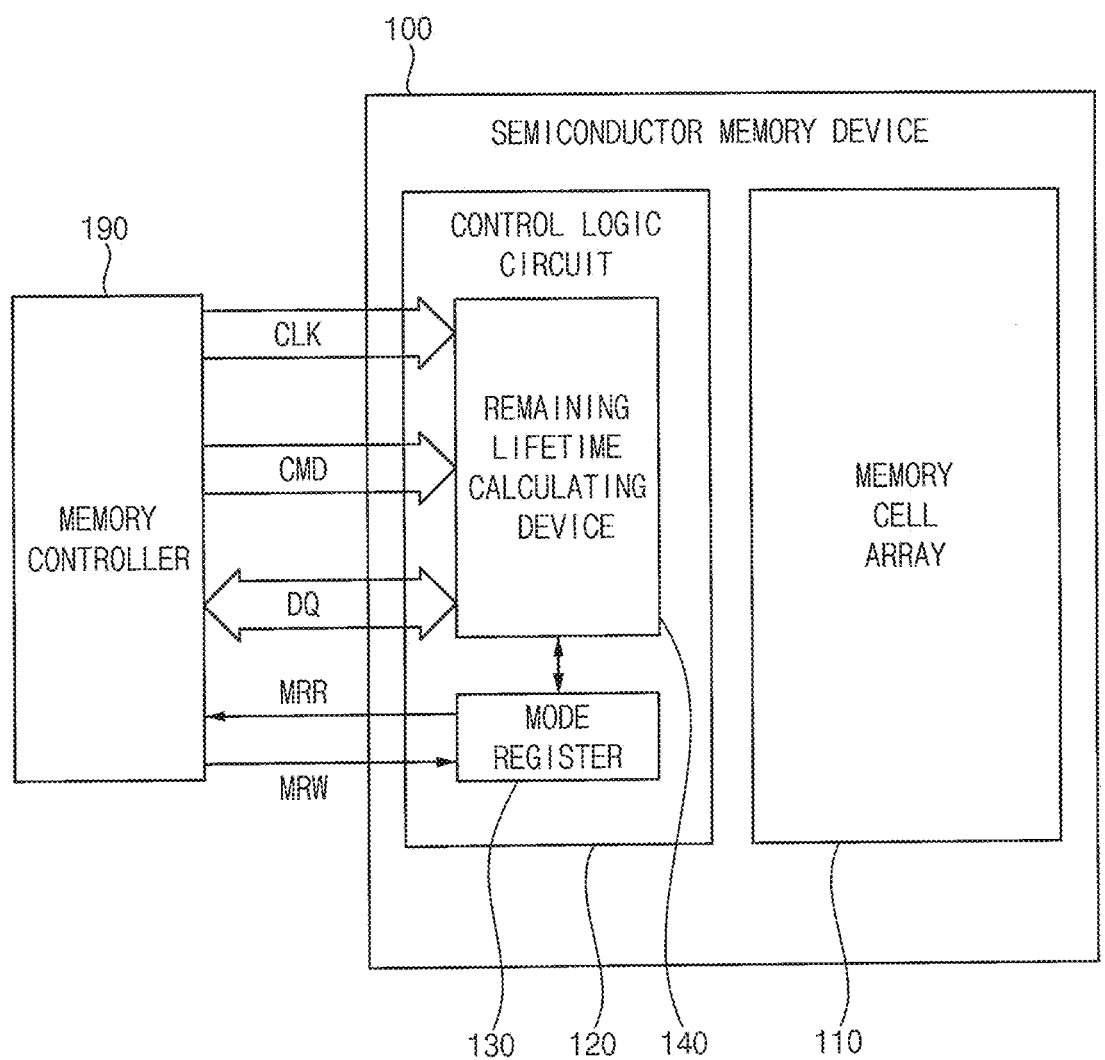
FIG. 1 is a block diagram that illustrates a semiconductor memory device according to embodiments.

Hereinafter, example embodiments of the present inventive concept will be described with reference to the accompanying drawings. Like reference symbols in the drawings may denote like ments, and to the extent that a description of an element has been omitted, it may be understood that the element is at least similar to corresponding elements that are described elsewhere in the specification.

FIG. 1 is a block diagram that illustrates a semiconductor memory device according to embodiments.

Referring to FIG. 1, a semiconductor memory device 100 may include a memory cell array 110 and a control logic circuit 120. The semiconductor memory device 100 receives a clock signal CLK and a command CMD from a memory controller 190, and transmits or receives data DQ to the memory controller 190 or from the memory controller 190.

The memory cell array 110 may include a plurality of wordlines, a plurality of bitlines, and a plurality of memory cells coupled to the plurality of wordlines and the plurality of bitlines. The plurality of memory cells of the memory cell array 110 may store the data DQ. In some embodiments, the semiconductor memory device 100 is, but is not limited to, a dynamic random access memory (DRAM) device, such as a dual data rate (DDR) synchronous dynamic random access memory (SDRAM), a low power dual data rate (LPDDR) SDRAM, or the like, and each memory cell may be, but is not limited to, a DRAM cell.

The control logic circuit 120 receives the clock signal CLK and the command CMD from the memory controller 190, and may transmit or receive the data DQ to the memory controller 190 or from the memory controller 190. The control logic circuit 120 may control the semiconductor memory device 100 to transmit the data DQ stored in the memory cell array 110 to the memory controller 190, or to perform a data read operation. Further, the control logic circuit 120 may control the semiconductor memory device 100 to store the data DQ received from the memory controller 190 in the memory cell array 110, or to perform a data write operation.

In the semiconductor memory device 100 according to embodiments of the present disclosure, the control logic circuit 120 may include a mode register 130 and a remaining lifetime calculating device 140.

The mode register 130 may store setting values which correspond to an operation mode of the semiconductor memory device 100. The memory controller 190 may store the setting values in the mode register 130 by performing a mode register write operation MRW. Further, the memory controller 190 may receive the setting values stored in the mode register 130 by performing a mode register read operation MRR.

The remaining lifetime calculating device 140 may count a number of the clock signal CLK received from the memory controller 190, the data DQ transmitted or received to or from the memory controller 190, and/or the command CMD received from the memory controller 190, and may predict or calculate a remaining lifetime of the semiconductor memory device 100 based on the counted number(s). The number of clock signals, the amount of data DQ transmitted or received, and the number of commands may be referred to as "usage metrics." Further, the remaining lifetime calculating device 140 may generate a remaining lifetime code representing the remaining lifetime of the semiconductor memory device 100 based on the counted number(s) (usage metrics), and may store the remaining lifetime code in the mode register 130. The remaining lifetime code stored in the mode register 130 may be provided to the memory controller 190 by the mode register read operation MRR, and the memory controller 190 may obtain the remaining lifetime of the semiconductor memory device 100 based on the remaining lifetime code. In some embodiments of the present disclosure, the remaining lifetime obtained by the memory controller 190 is be provided to a user or a system manager by using an output device, such as a display device, and the system manager checks the remaining lifetime of the semiconductor memory device 100 in real time. Further, before a lifetime of the semiconductor memory device 100 is exhausted, or before the semiconductor memory device 100 has no remaining lifetime, e.g., as indicated by the output device, the system manager may replace the semiconductor memory device 100. Accordingly, a system error caused by lifetime exhaustion of the semiconductor memory device 100 may be prevented.

Figure 2:
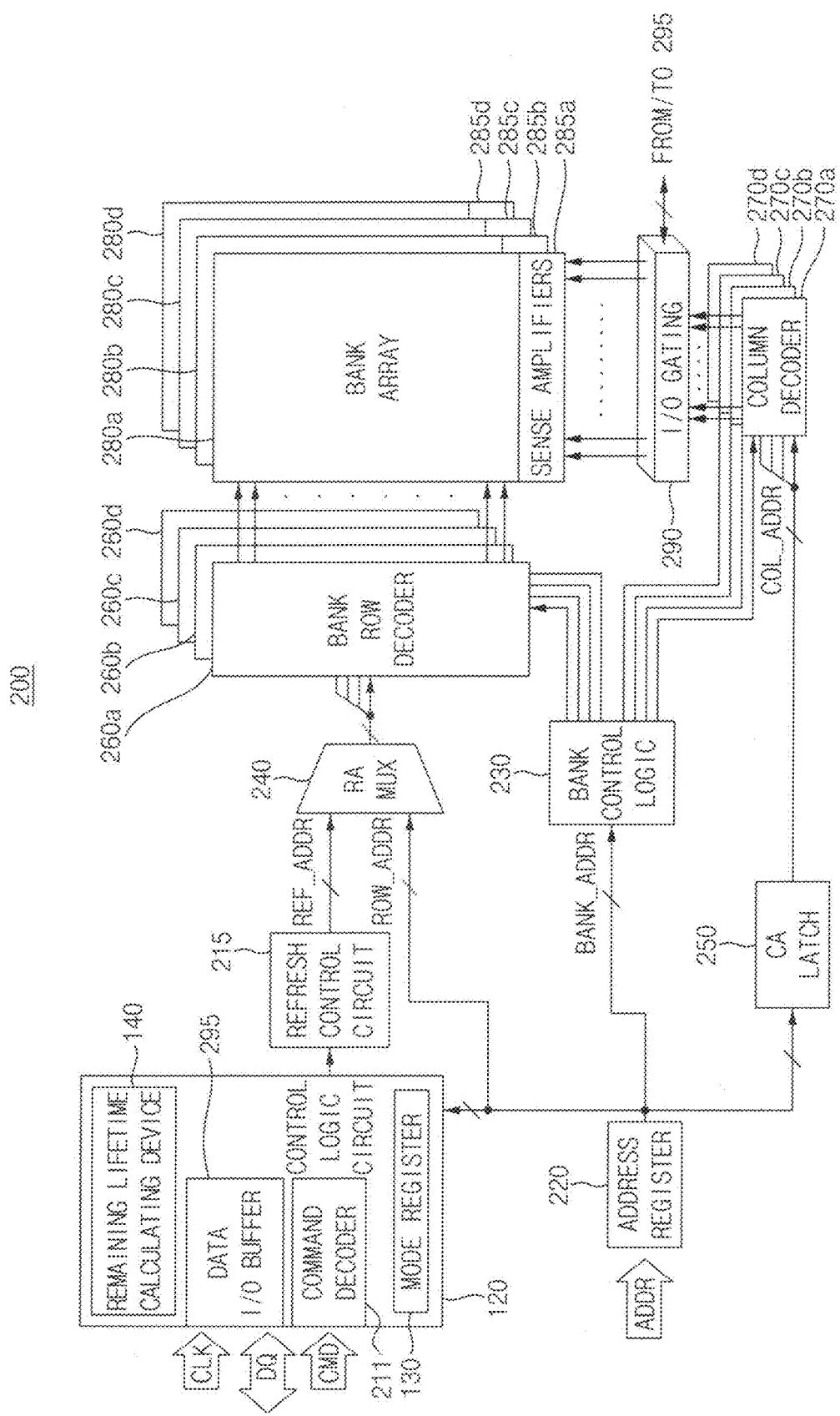
FIG. 2 is a block diagram that illustrates an example of a semiconductor memory device according to embodiments.

FIG. 2 is a block diagram that illustrates an example of a semiconductor memory device according to embodiments of the present disclosure.

Referring to FIG. 2, a semiconductor memory device 200 may include a control logic circuit 120, a command decoder 211, a mode register 130, a refresh control circuit 215, an address register 220, a bank control logic circuit 230, a row address multiplexer 240, a column address latch 250, a row decoder, a column decoder, a memory cell array, a sense amplifier unit (e.g., sense amplifier), an input/output (I/O) gating circuit 290, a data I/O buffer 295. It is understood that one or more other embodiments are not limited to the combination and number of components illustrated and described in FIG. 2.

In some embodiments of the present disclosure, the semiconductor memory device 200 may be a volatile memory device. For example, the semiconductor memory device 200 may be one of various volatile memory devices, such as a DRAM, a mobile DRAM, a DDR DRAM, an LPDDR DRAM, a graphic DDR (GDDR) DRAM, or the like.

The memory cell array includes a plurality of memory cells. The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d respectively connected to the first through fourth bank arrays 280a, 280b, 280c and 280d. The column decoder may include a plurality of bank column decoders, e.g., first through fourth bank column decoders 270a, 270b, 270c and 270d respectively connected to the first through fourth bank arrays 280a, 280b, 280c and 280d. The sense amplifier unit may include a plurality of bank sense amplifiers, e.g., first through fourth bank sense amplifiers 285a, 285b, 285c and 285d respectively connected to the first through fourth bank arrays 280a, 280b, 280c and 280d.

The first through fourth bank arrays 280a to 280d, the first through fourth bank row decoders 260a to 260d, the first through fourth bank column decoders 270a to 270d, and the first through fourth bank sense amplifiers 285a to 285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 2 illustrates an example semiconductor memory device 200 including four banks, it is understood that one or more other embodiments are not limited thereto, and the semiconductor memory device 200 may include any number of banks. It is also understood that while the components illustrated in FIG. 2 in quantities of four have a one-to-one correspondence with each other, one or more other embodiments are not limited thereto. For example, an embodiment could include more or less decoders or sensors than shown in the embodiment of FIG. 2.

The address register 220 may receive an address ADDR including a bank address BANK_ADDR, a row address ROW_ADDR and a column address COL_ADDR from a memory controller, e.g., the memory controller 190 in FIG. 1. The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a to 260d corresponding to the received bank address BANK_ADDR may be activated in response to the bank control signals generated by the bank control logic circuit 230, and one of the first through fourth bank column decoders 270a to 270d corresponding to the received bank address BANK_ADDR may be activated in response to the bank control signals generated by the bank control logic circuit 230.

The refresh control circuit 215 may generate a refresh address REF_ADDR in response to receipt of a refresh command or upon entering a self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic circuit 120.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240, e.g., the row address ROW_ADDR or the refresh address REF_ADDR, may be sent to the first through fourth bank row decoders 260a to 260d.

The activated bank row decoder of the first through fourth bank row decoders 260a to 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may send the temporarily stored or received column address COL_ADDR to the first through fourth bank column decoders 270a to 270d.

The activated bank column decoder of the first through fourth bank column decoders 270a to 270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, the I/O gating circuit 290 may include an input data mask logic, read data latches for storing data DQ output from the first through fourth bank arrays 280a to 280d, and write drivers for writing data DQ to the first through fourth bank arrays 280a to 280d.

Data DQ to be read from one of the first through fourth bank arrays 280a to 280d may be sensed by a sense amplifier coupled to the corresponding bank array, and may be stored in the read data latches. The data DQ stored in the read data latches may be provided to the memory controller via the data I/O buffer 295. Data DQ that is to be written to one of the first through fourth bank arrays 280a to 280d may be provided to the data I/O buffer 295 from the memory controller (e.g., from the memory controller 190 in FIG. 1). The data DQ provided to the data I/O buffer 295 may be written to the corresponding bank array via the write drivers in the I/O gating circuit 290. Although FIG. 2 illustrates an example where the data I/O buffer 295 is located inside the control logic circuit 120, in other embodiments, the data I/O buffer 295 can be located outside the control logic circuit 120.

The control logic circuit 120 may control an operation of the semiconductor memory device 200. For example, the control logic circuit 120 may generate control signals for the semiconductor memory device 200 to perform a data write operation or a data read operation. The control logic circuit 120 may include a command decoder 211 that decodes a command CMD received from the memory controller, and may further include the mode register 130 that sets an operation mode of the semiconductor memory device 200. For example, the command decoder 211 may generate the control signals corresponding to the command CMD by decoding a write enable signal, a row address strobe signal, a column address strobe signal, a chip select signal, etc. The control logic circuit 120 may further receive a clock signal CLK and a clock enable signal for operating the semiconductor memory device 200 in a synchronous manner.

The control logic circuit 120 may further include a remaining lifetime calculating device 140. Detailed configurations and operations of the remaining lifetime calculating device 140 will be described with reference to FIGS. 3 through 19.

Although the semiconductor memory device 200 according to embodiments is described based on a DRAM device, the semiconductor memory device 200 according to embodiments may be implemented as any volatile memory device and/or nonvolatile memory device, e.g., a static random access memory (SRAM), a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 3:
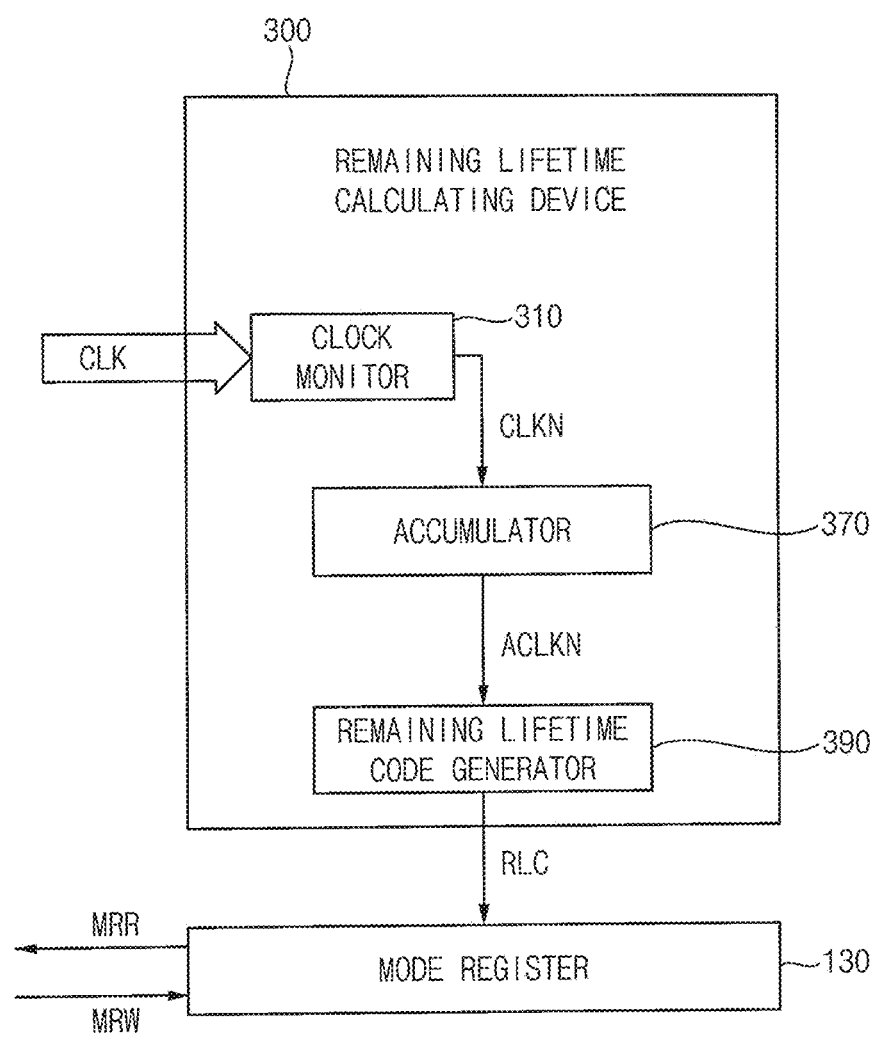
FIG. 3 is a block diagram that illustrates a remaining lifetime calculating device according to embodiments.
Figures 4A, 4B:
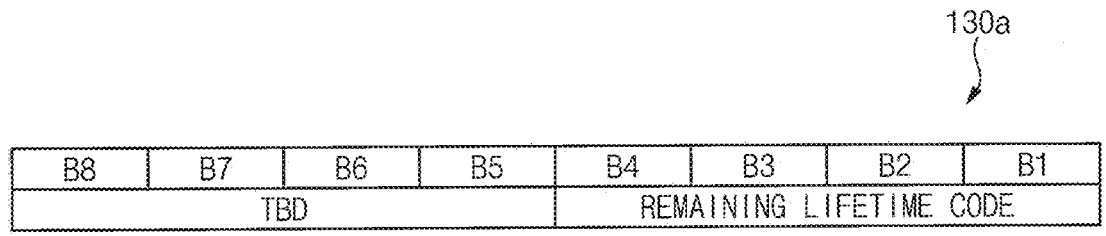
FIG. 4A is a diagram that illustrates an example of a mode register storing a remaining lifetime code.
FIG. 4B is a diagram of an example of a remaining lifetime code.

FIG. 3 is a block diagram that illustrates a remaining lifetime calculating device according to embodiments, FIG. 4A is a diagram that illustrates an example of a mode register storing a remaining lifetime code, and FIG. 4B is a diagram of an example of a remaining lifetime code.

Referring to FIG. 3, a remaining lifetime calculating device 300 may include a clock monitor 310, an accumulator 370 and a remaining lifetime code generator 390. The remaining lifetime calculating device 300 may generate a remaining lifetime code RLC representing a remaining lifetime of a semiconductor memory device by counting, e.g., a clock signal CLK received from a memory controller.

The clock monitor 310 may count a clock number CLKN of the clock signal CLK received from the memory controller. For example, the clock number CLKN may correspond to the number of pulses of the clock signal CLK. In some embodiments, the clock monitor 310 may detect or monitor a clock speed or a clock rate, e.g., the number of clock pulses per second, of the clock signal CLK.

The accumulator 370 may calculate an accumulated clock number ACLKN by accumulating the clock number CLKN. For example, the accumulator 370 may receive the clock number CLKN from the clock monitor 310, and may calculate the accumulated clock number ACLKN by adding the clock number CLKN to a previous clock number. The accumulated clock number ACLKN may correspond to the number of total clock pulses received from the memory controller since the semiconductor memory device was manufactured. For example, the accumulated clock number ACLKN may correspond to the number of total clock pulses generated by the semiconductor memory device. In some embodiments, the semiconductor memory device includes a nonvolatile memory, and the accumulator 370 stores the accumulated clock number ACLKN in the nonvolatile memory periodically and/or when the semiconductor memory device is powered off such that the accumulated clock number ACLKN stored in the nonvolatile memory may be used as the previous clock number at the next calculation. For example, the accumulated clock number ACLKN may persist even after on/off cycles of the semiconductor memory device.

The remaining lifetime code generator 390 may determine a maximum clock number corresponding to a maximum lifetime of the semiconductor memory device, may receive the accumulated clock number ACLKN from the accumulator 370, and may calculate a remaining clock number by subtracting the accumulated clock number ACLKN from the maximum clock number. In some embodiments, the maximum lifetime of the semiconductor memory device is previously determined. For example, the maximum lifetime may be previously determined by an experiment for a representative sample of the semiconductor memory devices or by a calculation. Further, in some embodiments, the maximum clock number is determined by multiplying the maximum lifetime by a clock speed, e.g., a clock rate or the number of clock pulses per second. For example, in a case where the maximum lifetime of the semiconductor memory device is about five years, or about $1.58*10^9$ seconds in certain condition(s), e.g., at a temperature of about 85 degrees, a data speed of about 6,400 Mbps, and a quad data rate (QDR) operation, and the clock speed is about 1,600 MHz, the maximum clock number may be "$(1.58*10^9)*(1.6*10^9)$", or about $2.5*10^{18}$.

The remaining lifetime code generator 390 may generate the remaining lifetime code RLC corresponding to the remaining clock number. In some embodiments, the remaining lifetime code generator 390 includes a mapping table that stores a plurality of remaining lifetime codes respectively corresponding to a plurality of remaining clock numbers, and generates the remaining lifetime code RLC corresponding to the remaining clock number by using the mapping table.

The remaining lifetime calculating device 300 may store the remaining lifetime code RLC generated by the remaining lifetime code generator 390 in a mode register 130. For example, as illustrated in FIG. 4A, the mode register 130a may store eight bits B1 through B8, and the remaining lifetime calculating device 300 may store the remaining lifetime code RLC in lower four bits B1 through B4 of the mode register 130a. Although FIG. 4A illustrates an example where data or information stored in upper four bits B5 through B8 of the mode register 130a is to be determined (or TBD), the mode register 130 according to embodiments is not limited to the example of FIG. 4A. Further, although FIG. 4A illustrates an example of the mode register 130a storing the eight bits B1 through B8, the mode register 130 according to embodiments is not limited to the example of FIG. 4A. For example, the mode register 130a illustrated in FIG. 4A may be a portion of the mode register 130 according to embodiments. For example, in some embodiments, the mode register 130a may be the mode register 130, and in some embodiments, the mode register 130a may be a part of the mode register 130.

The remaining lifetime code RLC stored in the mode register 130 may represent the remaining lifetime of the semiconductor memory device. For example, as illustrated in FIGS. 4A and 4B, the remaining lifetime code RLC stored in the mode register 130a may have a first value (e.g., '0000') representing that the remaining lifetime is the maximum lifetime, or representing about 100% of the maximum lifetime, a second value (e.g., '1111') representing that no remaining lifetime exists, or representing about 0% of the maximum lifetime, or a value (e.g., '0001' through '1110') between the first value and the second value representing a ratio (e.g., about 5% through about 90%) of the remaining lifetime to the maximum lifetime.

Figure 5:
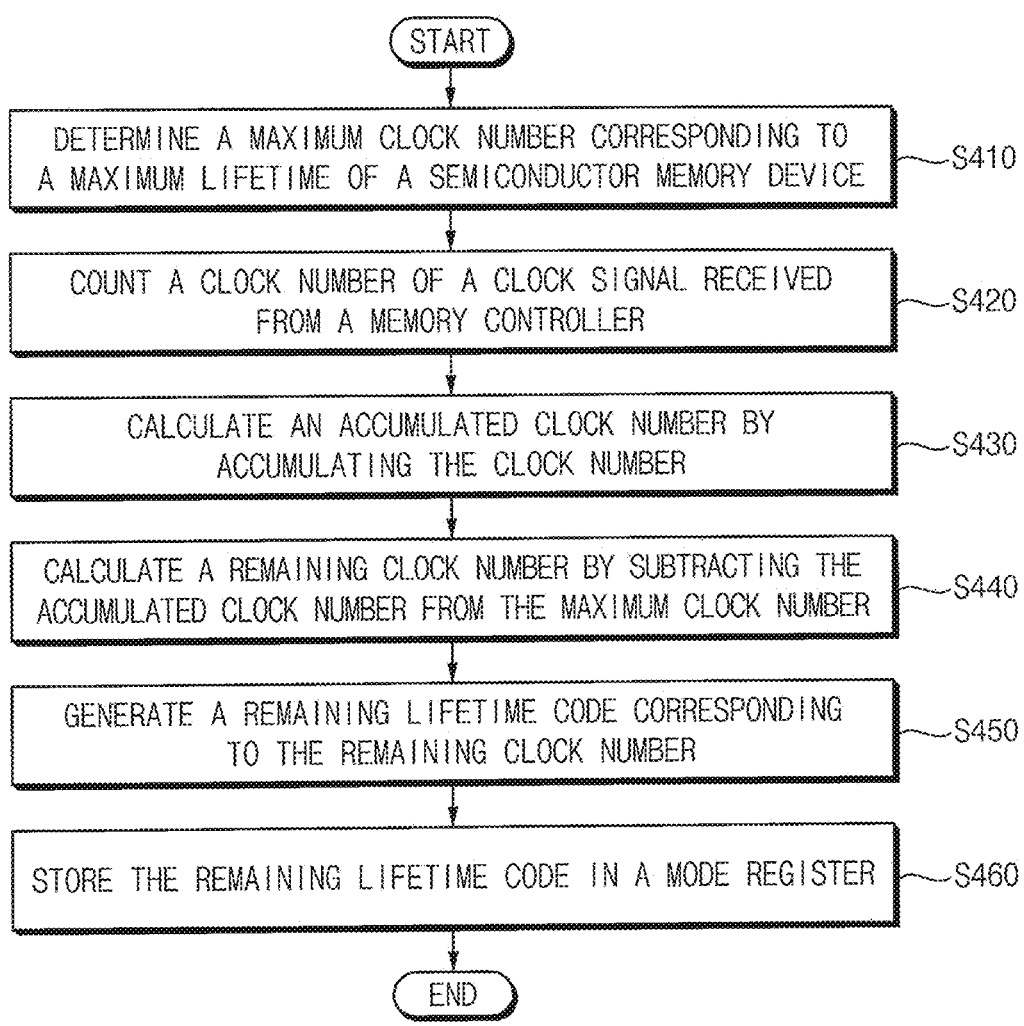
FIG. 5 is a flowchart that illustrates a method of calculating a remaining lifetime of a semiconductor memory device according to embodiments.

FIG. 5 is a flowchart that illustrates a method of calculating a remaining lifetime of a semiconductor memory device according to embodiments.

Referring to FIGS. 3 and 5, a remaining lifetime calculating device 300 may determine a maximum clock number corresponding to a maximum lifetime of a semiconductor memory device (step S410). For example, the maximum lifetime may be previously determined by an experiment or by a calculation, and the maximum clock number may be determined by multiplying the maximum lifetime by a clock speed of a clock signal CLK.

A clock monitor 310 may count a clock number CLKN of the clock signal CLK received from a memory controller (step S420), and an accumulator 370 may calculate an accumulated clock number ACLKN by accumulating the clock number CLKN (step S430). For example, the accumulator 370 may increment a previous clock number by the clock number CLKN to calculate the accumulated clock number ACLKN.

A remaining lifetime code generator 390 may calculate a remaining clock number by subtracting the accumulated clock number ACLKN from the maximum clock number (step S440), and may generate a remaining lifetime code RLC corresponding to the remaining clock number (step S450).

The remaining lifetime calculating device 300 may store the remaining lifetime code RLC in a mode register 130 (step S460). The remaining lifetime code RLC stored in the mode register 130 may be provided to the memory controller by a mode register read operation MRR, and the memory controller may check the remaining lifetime of the semiconductor memory device based on the remaining lifetime code RLC. In some embodiments, a memory system including the semiconductor memory device and the memory controller displays the remaining lifetime of the semiconductor memory device by using a display device.

Figure 6:
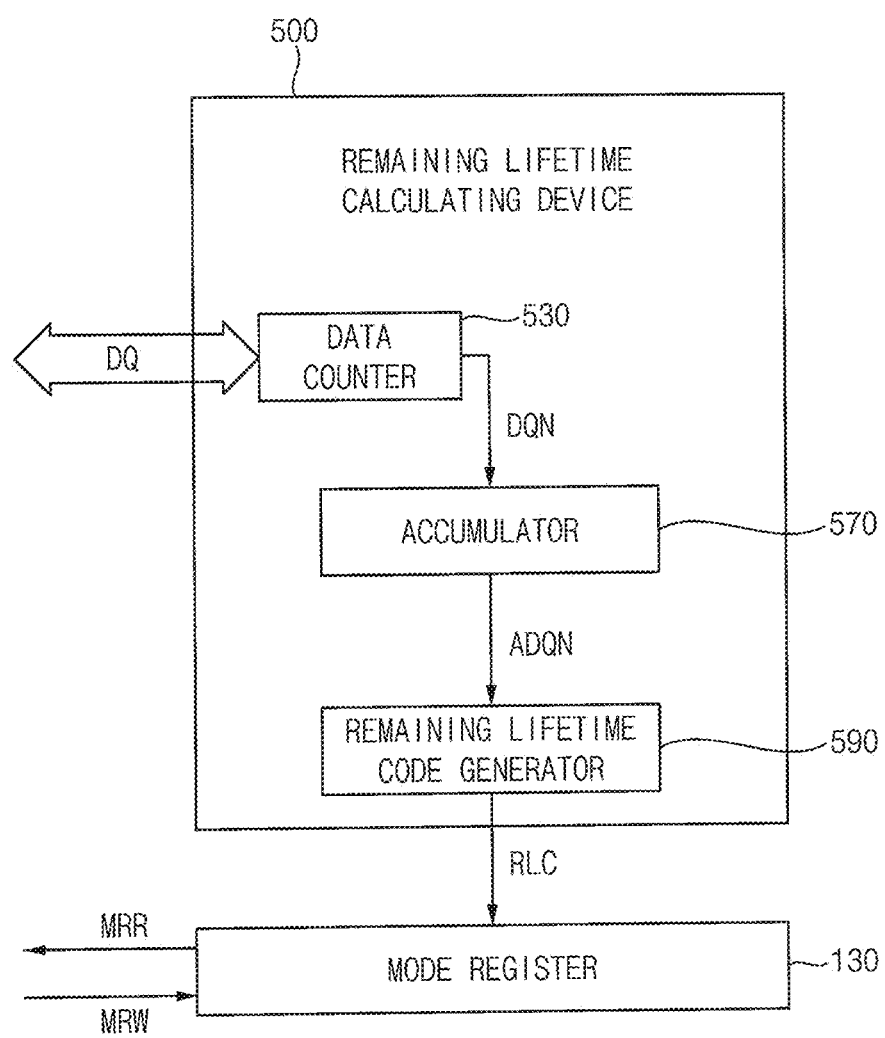
FIG. 6 is a block diagram that illustrates a remaining lifetime calculating device according to embodiments.

FIG. 6 is a block diagram that illustrates a remaining lifetime calculating device according to embodiments.

Referring to FIG. 6, a remaining lifetime calculating device 500 may include a data counter 530, an accumulator 570 and a remaining lifetime code generator 590. Unlike the remaining lifetime calculating device 300 of FIG. 3 that counts a clock signal, the remaining lifetime calculating device 500 of FIG. 6 may generate a remaining lifetime code RLC representing a remaining lifetime of a semiconductor memory device by counting data DQ transmitted or received to a memory controller or from the memory controller.

The data counter 530 may count a data number DQN of the data DQ transmitted or received to the memory controller or from the memory controller. For example, the data number DQN may correspond to the number of bits of the data DQ transferred through at least one data line between the semiconductor memory device and the memory controller.

The accumulator 570 may calculate an accumulated data number ADQN by accumulating the data number DQN. For example, the accumulator 570 may receive the data number DQN from the data counter 530, and may calculate the accumulated data number ADQN by adding the data number DQN to a previous data number. The accumulated data number ADQN may correspond to the number of total bits of the data DQ transmitted or received to the memory controller or from the memory controller since the semiconductor memory device was manufactured. In some embodiments, the semiconductor memory device includes a nonvolatile memory, and the accumulator 570 stores the accumulated data number ADQN in the nonvolatile memory periodically and/or when the semiconductor memory device is powered off such that the accumulated data number ADQN stored in the nonvolatile memory may be used as the previous data number at the next calculation.

The remaining lifetime code generator 590 may determine a maximum data number corresponding to a maximum lifetime of the semiconductor memory device, may receive the accumulated data number ADQN from the accumulator 570, and may calculate a remaining data number by subtracting the accumulated data number ADQN from the maximum data number. In some embodiments, the maximum data is by multiplying the maximum lifetime by a data efficiency, and further by a data speed, e.g., a data bitrate or the number of data bits per second. In some embodiments, the data efficiency corresponds to a bus occupancy rate of the data DQ, and the data efficiency for determining the maximum data number may be set by using a mode register 130 by the memory controller. For example, in a case where the maximum lifetime of the semiconductor memory device is about five years, or about $1.58*10^9$ seconds in certain conditions, e.g., at a temperature of about 85 degrees and a data speed of about 6,400 Mbps, and the data efficiency is about 80%, the maximum data number may be "$(1.58*10^9)*(0.8)*(6.4*10^9)$", or about $8.1*10^{18}$.

The remaining lifetime code generator 590 may generate the remaining lifetime code RLC corresponding to the remaining data number. In some embodiments, the remaining lifetime code generator 590 includes a mapping table that stores a plurality of remaining lifetime codes respectively corresponding to a plurality of remaining data numbers, and may generate the remaining lifetime code RLC corresponding to the remaining data number by using the mapping table. The remaining lifetime calculating device 500 may store the remaining lifetime code RLC generated by the remaining lifetime code generator 590 in the mode register 130. The remaining lifetime code RLC stored in the mode register 130 may represent the remaining lifetime of the semiconductor memory device.

Figure 7:
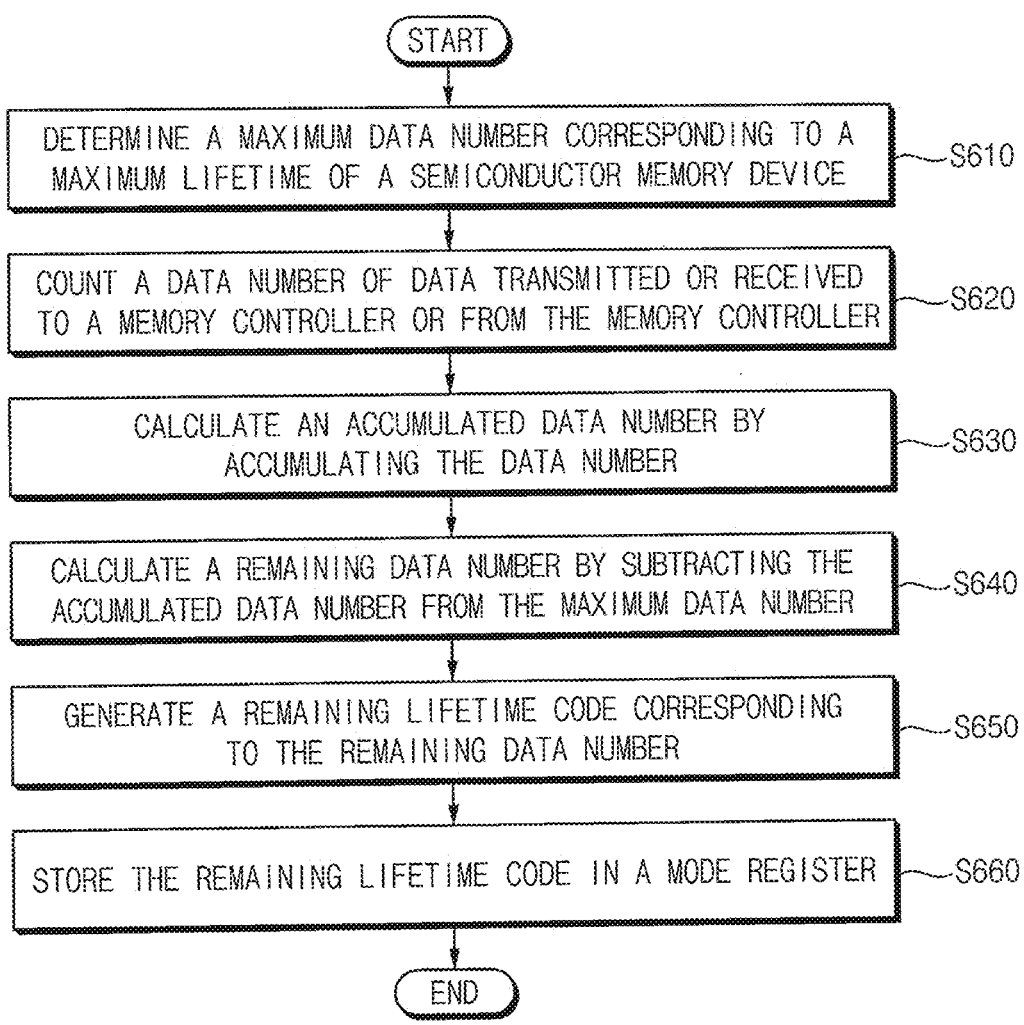
FIG. 7 is a flowchart that illustrates a method of calculating a remaining lifetime of a semiconductor memory device according to embodiments.

FIG. 7 is a flowchart that illustrates a method of calculating a remaining lifetime of a semiconductor memory device according to embodiments.

Referring to FIGS. 6 and 7, a remaining lifetime calculating device 500 may determine a maximum data number corresponding to a maximum lifetime of a semiconductor memory device (step S610). For example, the maximum data number may be determined by multiplying the maximum lifetime by a data efficiency by a data speed.

A data counter 530 may count a data number DQN of data DQ transmitted or received to or from a memory controller (step S620), and an accumulator 570 may calculate an accumulated data number ADQN by accumulating the data number DQN (step S630). For example, the accumulator 570 may increment a previous data number by the data number DQN to calculate the accumulated clock number ADQN.

A remaining lifetime code generator 590 may calculate a remaining data number by subtracting the accumulated data number ADQN from the maximum data number (step S640), and may generate a remaining lifetime code RLC corresponding to the remaining data number (step S650).

The remaining lifetime calculating device 500 may store the remaining lifetime code RLC in a mode register 130 (step S660). The remaining lifetime code RLC stored in the mode register 130 may be provided to the memory controller by a mode register read operation MRR, and the memory controller may check the remaining lifetime of the semiconductor memory device based on the remaining lifetime code RLC.

Figure 8:
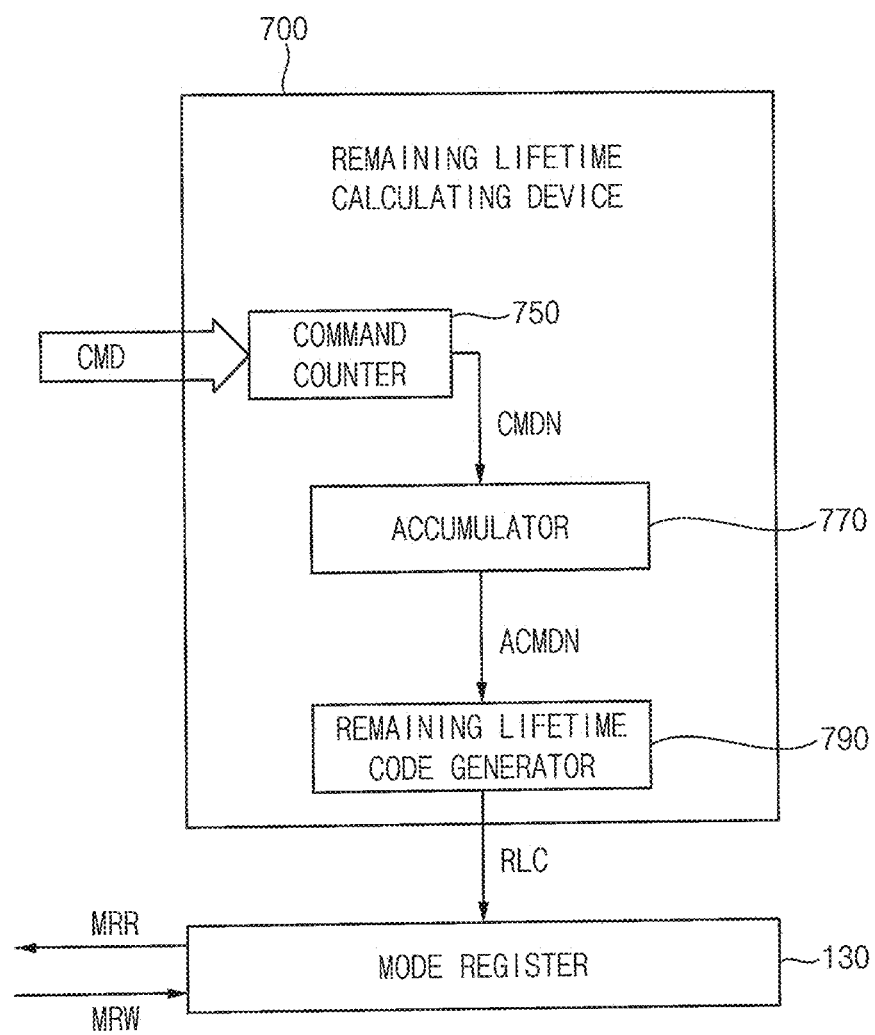
FIG. 8 is a block diagram that illustrates a remaining lifetime calculating device according to embodiments.

FIG. 8 is a block diagram that illustrates a remaining lifetime calculating device according to embodiments.

Referring to FIG. 8, a remaining lifetime calculating device 700 may include a command counter 750, an accumulator 770 and a remaining lifetime code generator 790. Unlike a remaining lifetime calculating device 300 of FIG. 3 that counts a clock signal and unlike a remaining lifetime calculating device 500 of FIG. 6 that counts data, the remaining lifetime calculating device 700 of FIG. 8 may generate a remaining lifetime code RLC representing a remaining lifetime of a semiconductor memory device by counting a command CMD received from a memory controller.

The command counter 750 may count a command number CMDN of the command CMD received from the memory controller. In some embodiments, the command counter 750 counts a read command requesting a data read operation of the semiconductor memory device and a write command requesting a data write operation of the semiconductor memory device, and the command number CMDN generated by the command counter 750 corresponds to the number of the read and write commands. In some embodiments, the command counter 750 counts a refresh command requesting a refresh operation of the semiconductor memory device, and the command number CMDN generated by the command counter 750 corresponds to the number of refresh commands. In still other embodiments, the command counter 750 may count a combination of the number of the read and write commands and the number of the refresh command as the command number CMDN.

The accumulator 770 may calculate an accumulated command number ACMDN by accumulating the command number CMDN. For example, the accumulator 770 may receive the command number CMDN from the command counter 750, and may calculate the accumulated command number ACMDN by adding the command number CMDN to a previous command number. The accumulated command number ACMDN may correspond to the number of total commands CMD received from the memory controller since the semiconductor memory device was manufactured. In some embodiments, the semiconductor memory device includes a nonvolatile memory, and the accumulator 770 stores the accumulated command number ACMDN in the nonvolatile memory periodically and/or when the semiconductor memory device is powered off such that the accumulated command number ACMDN stored in the nonvolatile memory may be used as the previous command number at the next calculation.

The remaining lifetime code generator 790 may determine a maximum command number corresponding to a maximum lifetime of the semiconductor memory device, may receive the accumulated command number ACMDN from the accumulator 770, and may calculate a remaining command number by subtracting the accumulated command number ACMDN from the maximum command number. In some embodiments, the command counter 750 counts the number of the read and write commands as the command number CMDN, and the maximum command number is determined by dividing a product of the maximum lifetime, a data efficiency and a data speed by a burst length. For example, in a case where the maximum lifetime of the semiconductor memory device is about five years, or about 1.58*10^9 seconds in certain conditions, e.g., at a temperature of about 85 degrees and a data speed of about 6,400 Mbps, the data efficiency is about 80%, and the burst length is about 16, the maximum command number may be "(1.58*10^9)*(0.8)*(6.4*10^9)/16", or about 0.5*10^18. In other example embodiments, the command counter 750 counts the number of the refresh command as the command number CMDN, and the maximum command number is determined by dividing the maximum lifetime by a refresh time interval (e.g., 'tREFI'). For example, in a case where the maximum lifetime of the semiconductor memory device is about five years, or about 1.58*10^9 seconds in a certain condition (e.g., at a temperature of about 85 degrees), and the refresh time interval is about 3.9 us, the maximum command number may be "(1.58*10^9)/(3.9*10^-6)", or about 0.4*10^15.

The remaining lifetime code generator 790 may generate the remaining lifetime code RLC corresponding to the remaining command number. In some embodiments, the remaining lifetime code generator 790 includes a mapping table that stores a plurality of remaining lifetime codes respectively corresponding to a plurality of remaining command numbers, and may generate the remaining lifetime code RLC corresponding to the remaining command number by using the mapping table. The remaining lifetime calculating device 700 may store the remaining lifetime code RLC generated by the remaining lifetime code generator 790 in the mode register 130. The remaining lifetime code RLC stored in the mode register 130 may represent the remaining lifetime of the semiconductor memory device.

It will be appreciated that the features, components, and steps described with reference to FIGS. 5 through 8, as well as from the proceeding embodiments described herein, may be combined into new embodiments which are in accordance with the present inventive concepts.

Figure 9:
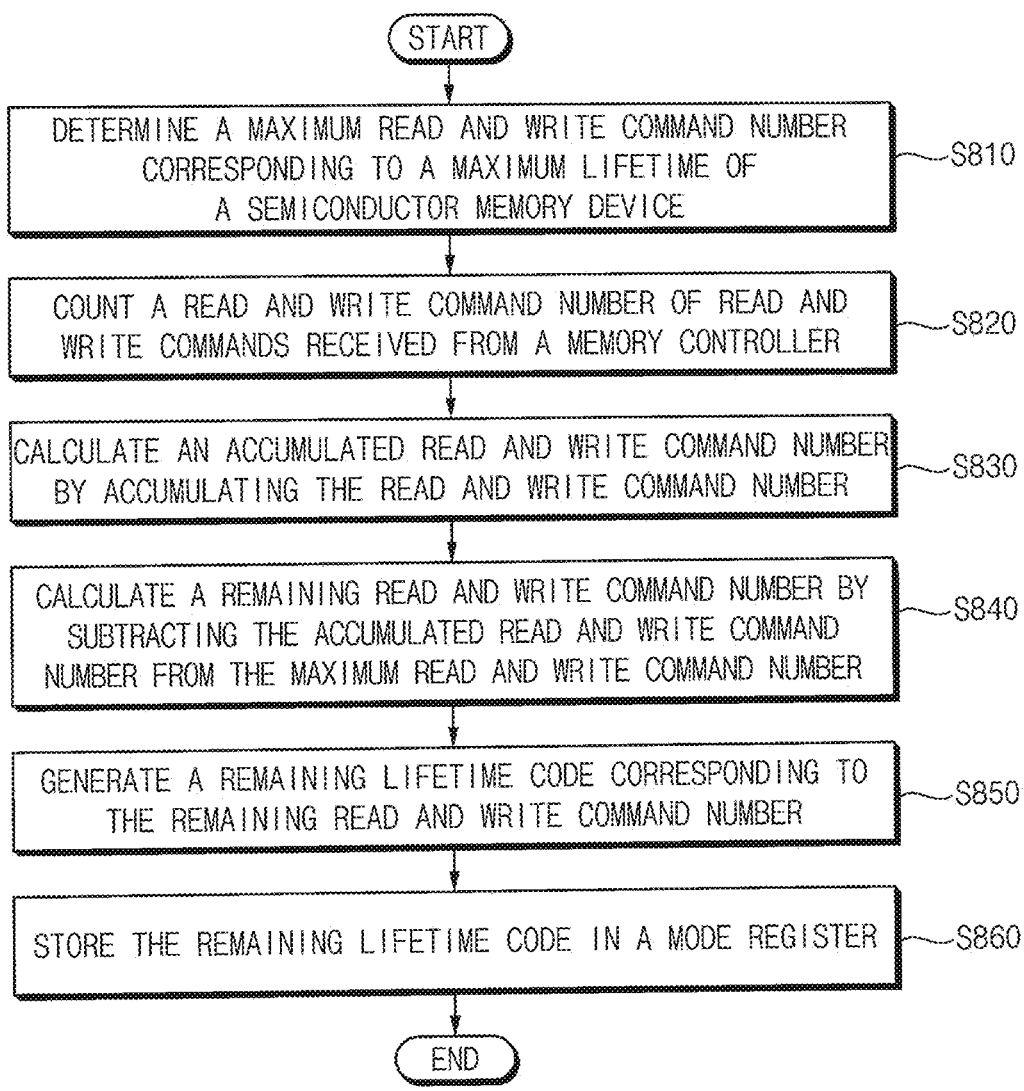
FIG. 9 is a flowchart that illustrates a method of calculating a remaining lifetime of a semiconductor memory device according to embodiments.

FIG. 9 is a flowchart that illustrates a method of calculating a remaining lifetime of a semiconductor memory device according to embodiments.

Referring to FIGS. 8 and 9, a remaining lifetime calculating device 700 may determine a maximum read and write command number corresponding to a maximum lifetime of a semiconductor memory device (step S810). For example, the maximum read and write command number may be determined by dividing a product of the maximum lifetime, a data efficiency and a data speed by a burst length.

A command counter 750 may count a read and write command number CMDN of read and write commands CMD received from a memory controller (step S820), and an accumulator 770 may calculate an accumulated read and write command number ACMDN by accumulating the read and write command number CMDN (step S830). For example, the accumulator 770 may increment a previous read and write command number by the read and write command number CMDN to calculate the accumulated read and write command number ACMDN.

A remaining lifetime code generator 790 may calculate a remaining read and write command number by subtracting the accumulated read and write command number ACMDN from the maximum read and write command number (step S840), and may generate a remaining lifetime code RLC corresponding to the remaining read and write command number (step S850).

The remaining lifetime calculating device 700 may store the remaining lifetime code RLC in a mode register 130 (step S860). The remaining lifetime code RLC stored in the mode register 130 may be provided to the memory controller by a mode register read operation MRR, and the memory controller may check the remaining lifetime of the semiconductor memory device based on the remaining lifetime code RLC.

Figure 10:
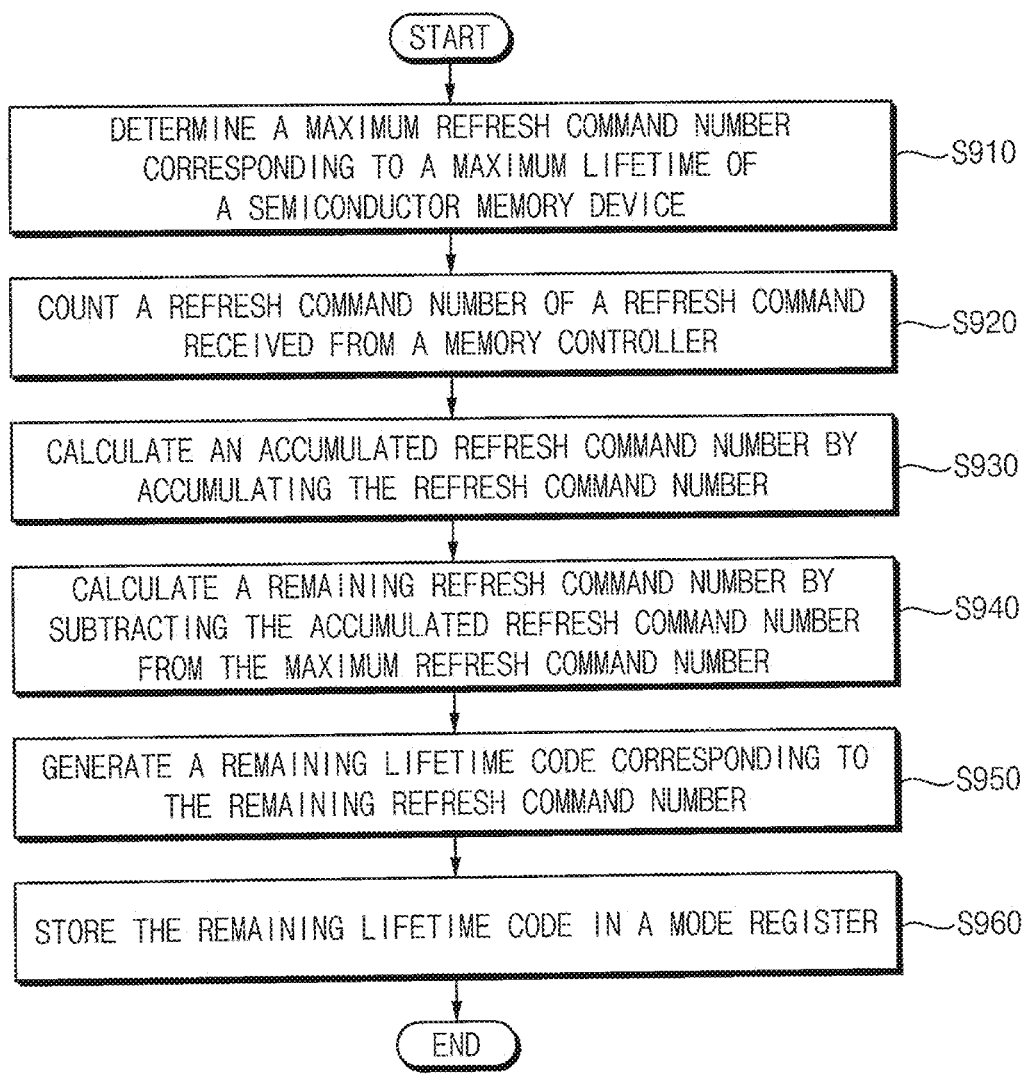
FIG. 10 is a flowchart that illustrates a method of calculating a remaining lifetime of a semiconductor memory device according to embodiments.

FIG. 10 is a flowchart that illustrates a method of calculating a remaining lifetime of a semiconductor memory device according to embodiments.

Referring to FIGS. 8 and 10, a remaining lifetime calculating device 700 may determine a maximum refresh command number corresponding to a maximum lifetime of a semiconductor memory device (step S910). For example, the maximum refresh command number may be determined by dividing the maximum lifetime by a refresh time interval.

A command counter 750 may count a refresh command number CMDN of a refresh command CMD received from a memory controller (step S920), and an accumulator 770 may calculate an accumulated refresh command number ACMDN by accumulating the refresh command number CMDN (step S930). For example, the accumulator 770 may increment a previous refresh command number by the refresh command number CMDN to calculate the accumulated refresh command number ACMDN.

A remaining lifetime code generator 790 may calculate a remaining refresh command number by subtracting the accumulated refresh command number ACMDN from the maximum refresh command number (step S940), and may generate a remaining lifetime code RLC corresponding to the remaining refresh command number (step S950).

The remaining lifetime calculating device 700 may store the remaining lifetime code RLC in a mode register 130 (step S960). The remaining lifetime code RLC stored in the mode register 130 may be provided to the memory controller by a mode register read operation MRR, and the memory controller may check the remaining lifetime of the semiconductor memory device based on the remaining lifetime code RLC.

Figure 11:
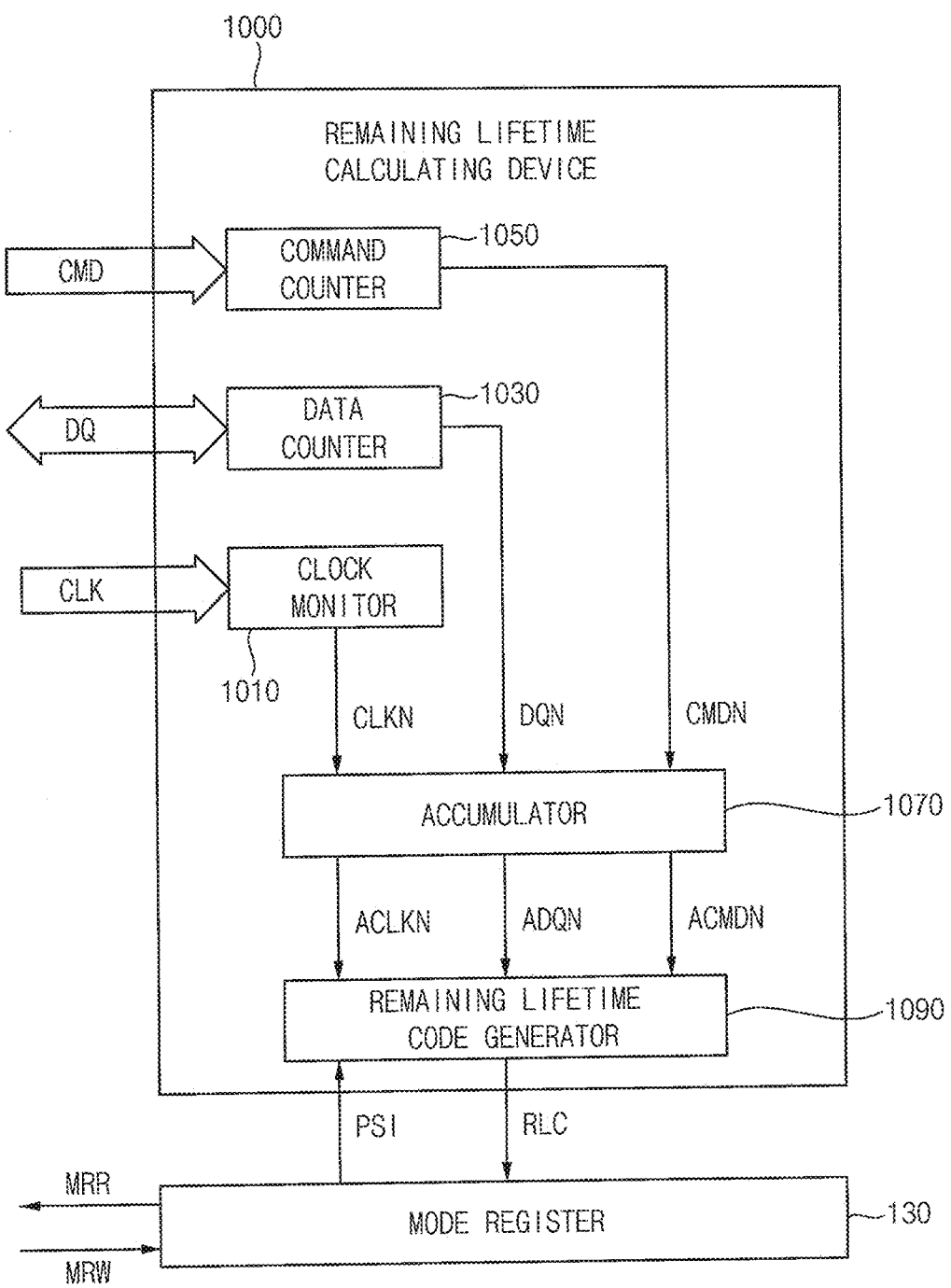
FIG. 11 is a block diagram that illustrates a remaining lifetime calculating device according to embodiments.
Figures 12A, 12B:
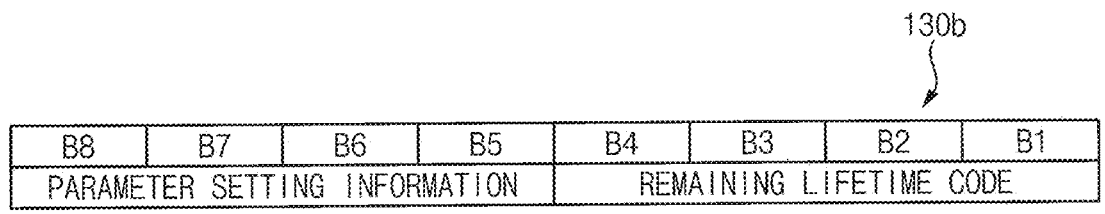
FIG. 12A is a diagram that illustrates an example of a mode register storing parameter setting information and a remaining lifetime code.
FIG. 12B is a diagram of an example of parameter setting information.

FIG. 11 is a block diagram that illustrates a remaining lifetime calculating device according to embodiments, FIG. 12A is a diagram that illustrates an example of a mode register storing parameter setting information and a remaining lifetime code, and FIG. 12B is a diagram of an example of parameter setting information.

Referring to FIG. 11, a remaining lifetime calculating device 1000 may include a clock monitor 1010, a data counter 1030, a command counter 1050, an accumulator 1070 and a remaining lifetime code generator 1090. The remaining lifetime calculating device 1000 may generate a remaining lifetime code RLC representing a remaining lifetime of a semiconductor memory device by counting a clock signal CLK, data DQ and/or a command CMD.

The clock monitor 1010 may count a clock number CLKN of the clock signal CLK received from a memory controller. The data counter 1030 may count a data number DQN of the data DQ transmitted or received to or from the memory controller. The command counter 1050 may count a command number CMDN of the command CMD received from the memory controller. In some embodiments, command counter 1050 may count a read and write command number of read and write commands received from the memory controller, and to count a refresh command number of a refresh command received from the memory controller.

The accumulator 1070 may calculate an accumulated clock number ACLKN by accumulating the clock number CLKN, may calculate an accumulated data number ADQN by accumulating the data number DQN, and may calculate an accumulated command number ACMDN by accumulating the command number CMDN. For example, the accumulator 1070 may accumulate these numbers by incrementing a previous number by a newly counted number. In some embodiments, the accumulator 1070 calculates, as the accumulated command number ACMDN, an accumulated read and write command number by accumulating the read and write command number and an accumulated refresh command number by accumulating the refresh command number.

The remaining lifetime code generator 1090 may calculate a remaining clock number by subtracting the accumulated clock number ACLKN from a maximum clock number corresponding to a maximum lifetime of the semiconductor memory device, may calculate a remaining data number by subtracting the accumulated data number ADQN from a maximum data number corresponding to the maximum lifetime, may calculate a remaining read and write command number by subtracting the accumulated read and write command number from a maximum read and write command number corresponding to the maximum lifetime, and may calculate a remaining refresh command number by subtracting the accumulated refresh command number from a maximum refresh command number corresponding to the maximum lifetime.

The remaining lifetime code generator 1090 may generate the remaining lifetime code RLC based on the remaining clock number, the remaining data number, the remaining read and write command number, and/or the remaining refresh command number. In some embodiments, the remaining lifetime code generator 1090 generates the remaining lifetime code RLC based on every one of: the remaining clock number, the remaining data number, the remaining read and write command number, and the remaining refresh command number. For example, the remaining lifetime code generator 1090 may determine a first remaining lifetime value corresponding to the remaining clock number, a second remaining lifetime value corresponding to the remaining data number, a third remaining lifetime value corresponding to the remaining read and write command number and a fourth remaining lifetime value corresponding to the remaining refresh command number, and may generate the remaining lifetime code RLC corresponding to a maximum value, a minimum value or an average value of the first through fourth remaining lifetime values.

In some embodiments, the memory controller may store parameter setting information PSI representing a parameter used to determine the remaining lifetime of the semiconductor memory device in a mode register 130. The remaining lifetime code generator 1090 may select the remaining clock number, the remaining data number, the remaining read and write command number, and/or the remaining refresh command number based on the parameter setting information PSI stored in the mode register 130, and may generate the remaining lifetime code RLC based on at least one selected number.

For example, as illustrated in FIG. 12A, the mode register 130b may store eight bits B1 through B8, and the memory controller may write the parameter setting information PSI to upper four bits B5 through B8 of the mode register 130b by performing a mode register write operation MRW. Further, lower four bits B1 through B4 of the mode register 130b may be used to store the remaining lifetime code RLC. Although FIG. 12A illustrates an example of the mode register 130b that stores the eight bits B1 through B8, the mode register 130 according to embodiments is not limited to the example of FIG. 12A. For example, the mode register 130b illustrated in FIG. 12A may be a portion of the mode register 130 according to embodiments.

The parameter setting information PSI stored in the mode register 130 may indicate which combination of the clock signal CLK, the data DQ, the read and write command and the refresh command is used in calculating the remaining lifetime of the semiconductor memory device. For example, as illustrated in FIGS. 12A and 12B, the fifth bit B5 of the mode register 130b may indicate whether the clock signal CLK is used in calculating the remaining lifetime, the sixth bit B6 of the mode register 130b may indicate whether the data DQ is used in calculating the remaining lifetime, the seventh bit B7 of the mode register 130b may indicate whether the read and write commands are used in calculating the remaining lifetime, and the eighth bit B8 of the mode register 130b may indicate whether the refresh command is used in calculating the remaining lifetime. For example, in a case where the parameter setting information PSI stored in the mode register 130 has a value of '0001', the remaining lifetime calculating device 1000 may use the clock signal CLK in calculating the remaining lifetime. For example, the remaining lifetime code generator 1090 may generate the remaining lifetime code RLC based on the remaining clock number. In another example, in a case where the parameter setting information PSI stored in the mode register 130 has a value of '1111', the remaining lifetime calculating device 1000 may use all of the clock signal CLK, the data DQ, the read and write commands RW_CMD and the refresh command REF_CMD in calculating the remaining lifetime. For example, the remaining lifetime code generator 1090 may generate the remaining lifetime code RLC based on the remaining clock number, the remaining data number, the remaining read and write command number, and the remaining refresh command number.

The remaining lifetime calculating device 1000 may store the remaining lifetime code RLC generated by the remaining lifetime code generator 1090 in the mode register 130. The remaining lifetime code RLC stored in the mode register 130 may represent the remaining lifetime of the semiconductor memory device.

Figure 13:
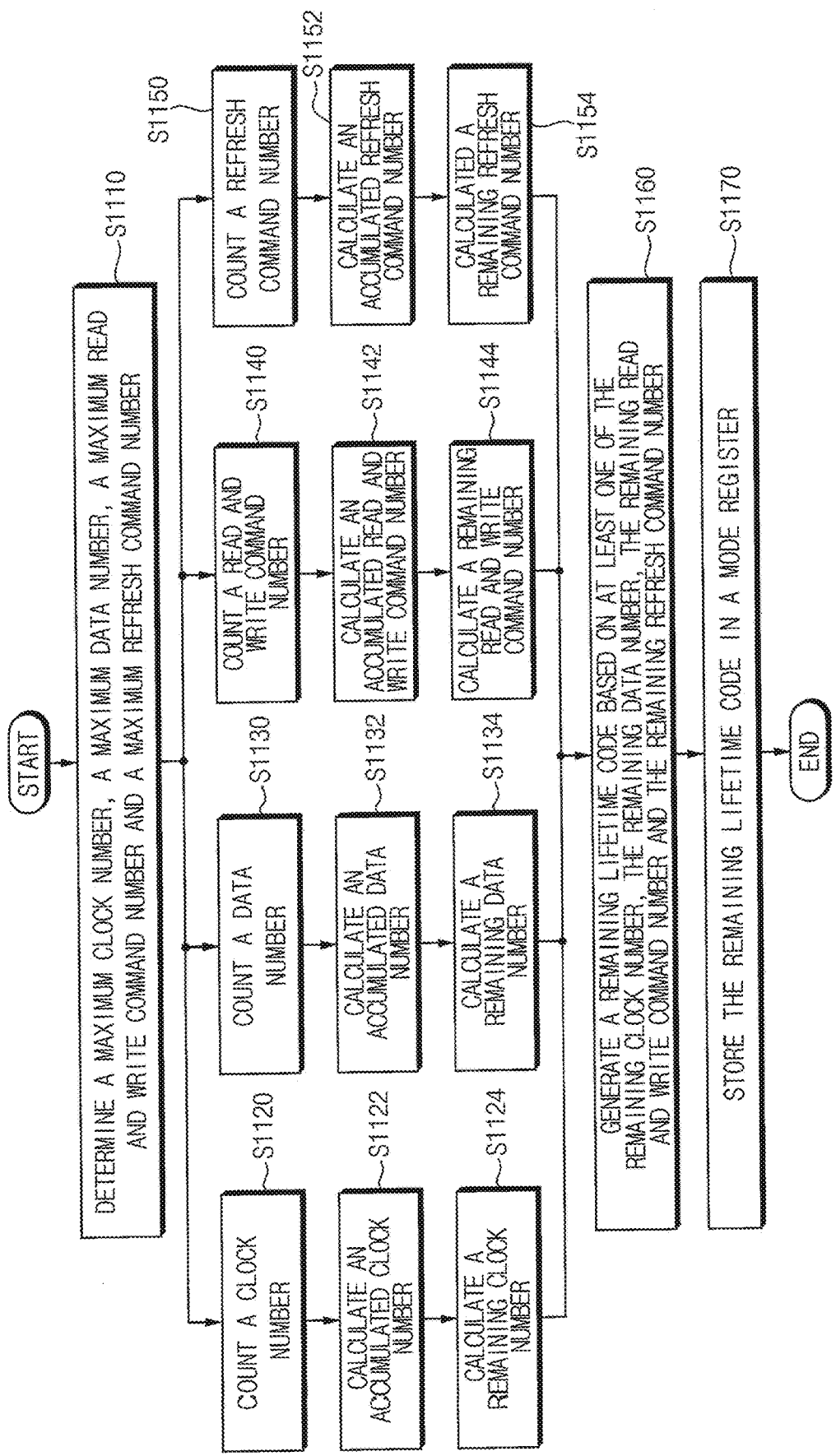
FIG. 13 is a flowchart that illustrates a method of calculating a remaining lifetime of a semiconductor memory device according to embodiments.

FIG. 13 is a flowchart that illustrates a method of calculating a remaining lifetime of a semiconductor memory device according to embodiments.

Referring to FIGS. 11 and 13, a remaining lifetime calculating device 1000 may determine a maximum clock number, a maximum data number, a maximum read and write command number and a maximum refresh command number corresponding to a maximum lifetime of a semiconductor memory device (step S1110).

A clock monitor 1010 may count a clock number CLJN of a clock signal CLK (step S1120), a data counter 1030 may count a data number DQN of data DQ (step S1130), a command counter 1050 may count a read and write command number of read and write commands and a refresh command number of a refresh command (steps S1140 and S1150). An accumulator 1070 may calculate an accumulated clock number ACLKN by accumulating the clock number CLKN (step S1122), may calculate an accumulated data number ADQN by accumulating the data number DQN (step S1132), may calculate an accumulated read and write command number by accumulating the read and write command number (step S1142), and may calculate an accumulated refresh command number by accumulating the refresh command number (step S1152). As discussed previously, the accumulation operation may include incrementing a previous number by a newly counted number.

A remaining lifetime code generator 1090 may calculate a remaining clock number by subtracting the accumulated clock number ACLKN from the maximum clock number (step S1124), may calculate a remaining data number by subtracting the accumulated data number ADQN from the maximum data number (step S1134), may calculate a remaining read and write command number by subtracting the accumulated read and write command number from the maximum read and write command number (step S1144), and may calculate a remaining refresh command number by subtracting the accumulated refresh command number from the maximum refresh command number (step S1154). The remaining lifetime code generator 1090 may generate a remaining lifetime code RLC based on the remaining clock number, the remaining data number, the remaining read and write command number, and/or the remaining refresh command number (step S1160). For example, the remaining lifetime code generator 1090 may generate the remaining lifetime code RLC representing a maximum value, a minimum value or an average value of a set including a first remaining lifetime value corresponding to the remaining clock number, a second remaining lifetime value corresponding to the remaining data number, a third remaining lifetime value corresponding to the remaining read and write command number and a fourth remaining lifetime value corresponding to the remaining refresh command number.

The remaining lifetime calculating device 1000 may store the remaining lifetime code RLC in a mode register 130 (step S1170).

Figure 14:
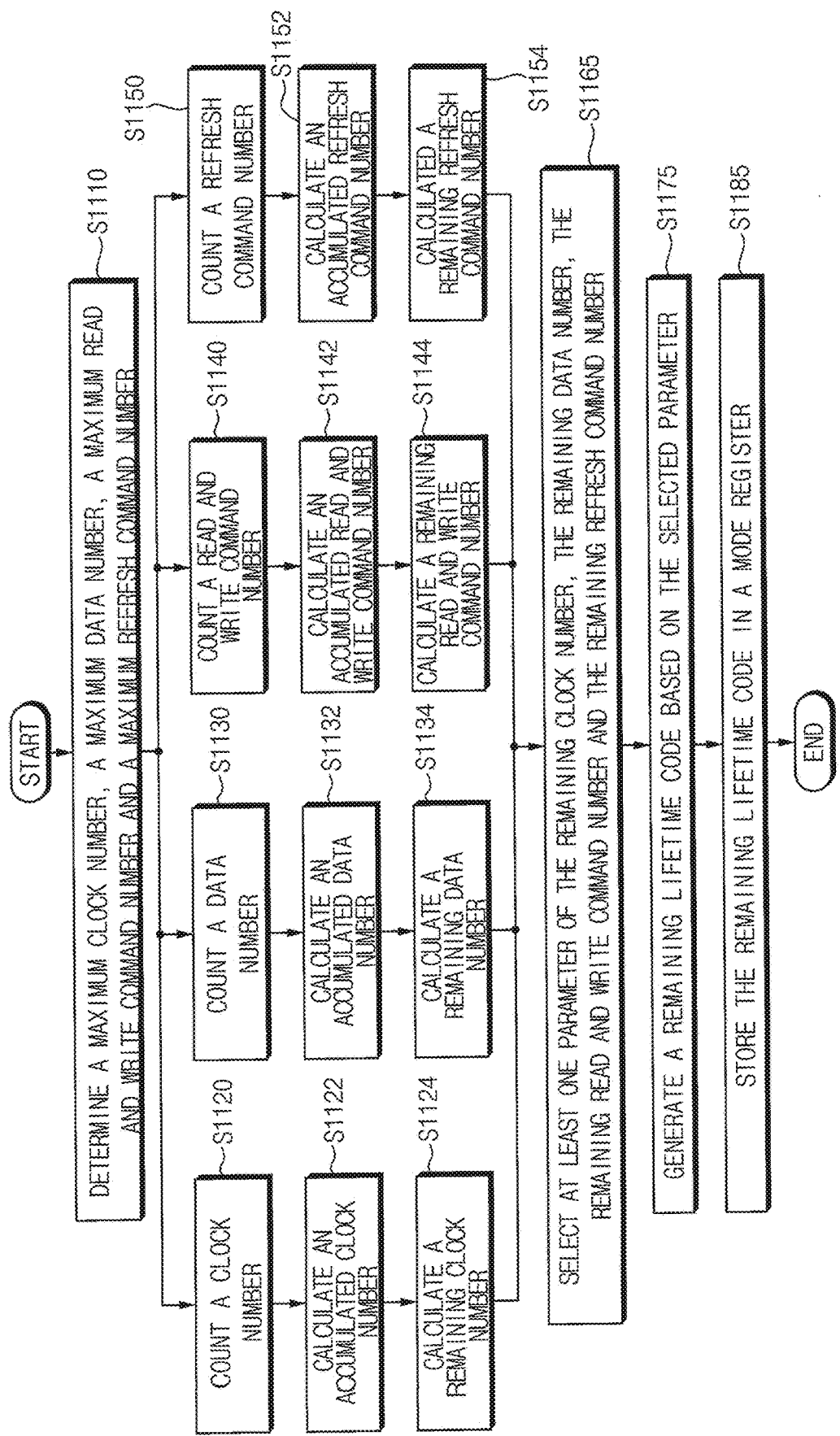
FIG. 14 is a flowchart that illustrates a method of calculating a remaining lifetime of a semiconductor memory device according to embodiments.

FIG. 14 is a flowchart that illustrates a method of calculating a remaining lifetime of a semiconductor memory device according to embodiments.

A method illustrated in FIG. 14 may be substantially the same as a method illustrated in FIG. 13, except that a parameter used in determining a remaining lifetime of a semiconductor memory device may be determined, based on parameter setting information PSI.

Referring to FIGS. 11 and 14, a remaining lifetime code generator 1090 may select at least one parameter of a remaining clock number, a remaining data number, a remaining read and write command number and a remaining refresh command number based on the parameter setting information PSI stored in a mode register 130 (step S1165), and may generate a remaining lifetime code RLC based on the selected parameter (step S1175). The remaining lifetime calculating device 1000 may store the remaining lifetime code RLC in the mode register 130 (step S1185).

Figure 15:
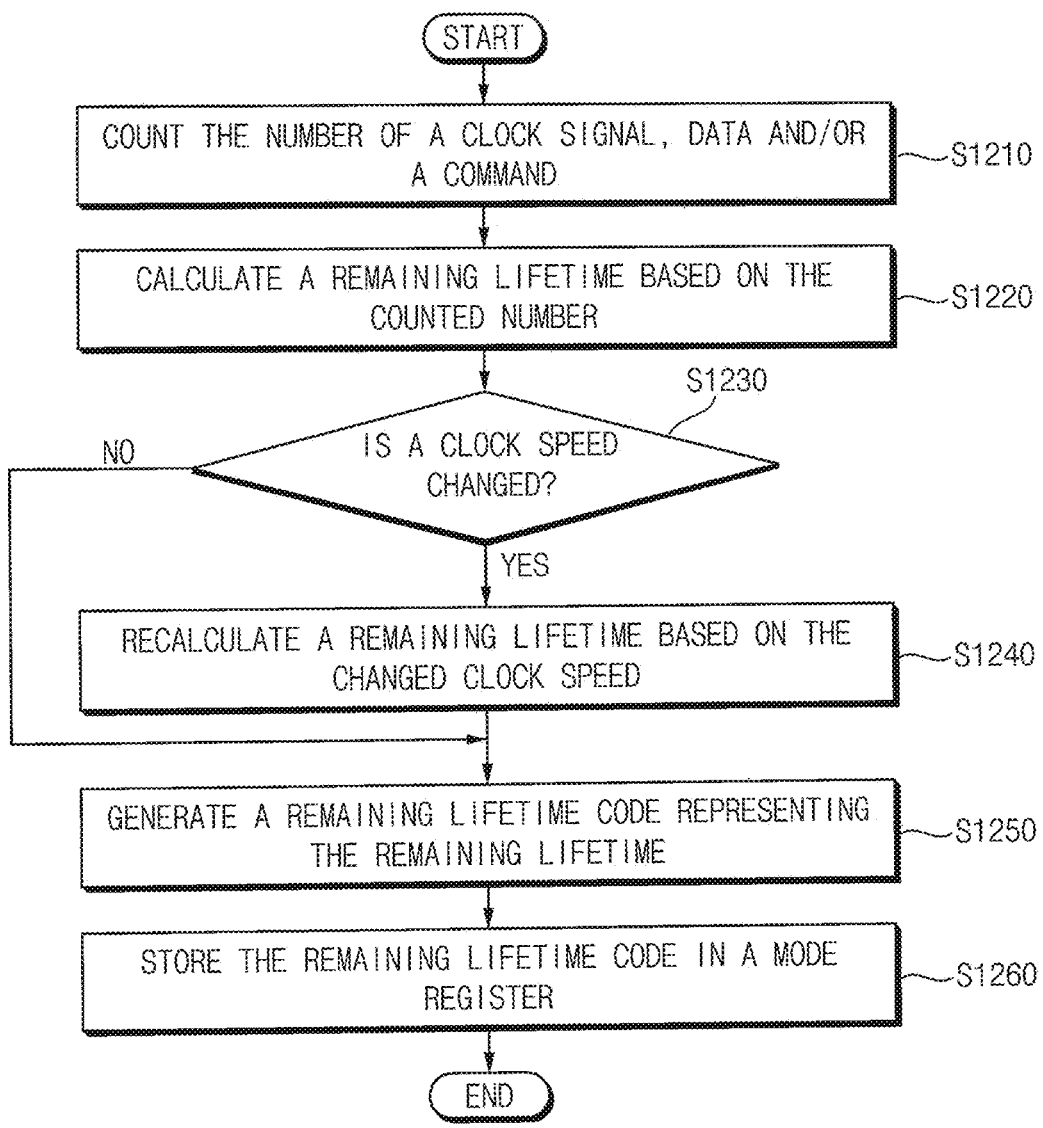
FIG. 15 is a flowchart that illustrates a method of calculating a remaining lifetime of a semiconductor memory device according to embodiments.

FIG. 15 is a flowchart that illustrates a method of calculating a remaining lifetime of a semiconductor memory device according to embodiments.

Referring to FIGS. 11 and 15, a remaining lifetime calculating device 1000 may count the number of a clock signal CLK, data DQ and/or a command CMD (step S1210), and may calculate a remaining lifetime of a semiconductor memory device based on the counted number(s) (e.g., usage metrics) (step S1220).

A clock monitor 1010 may monitor a clock speed of the clock signal CLK. In a case where the clock speed of the clock signal CLK is not changed (step S1230: NO), the remaining lifetime calculating device 1000 may generate a remaining lifetime code RLC corresponding to the calculated remaining lifetime from step S1220 (at step S1250), and may store the remaining lifetime code RLC in a mode register 130 (step S1260).

In a case where the clock speed of the clock signal CLK is changed (step S1230: YES), the remaining lifetime calculating device 1000 may recalculate the remaining lifetime of the semiconductor memory device based on the changed clock speed (step S1240). For example, as the clock speed decreases, the recalculated remaining lifetime may increase. In an example, in a case where the calculated remaining lifetime is about 50% of a maximum lifetime, and the clock speed is changed from about 1600 MHz to about 800 MHz, the remaining lifetime calculating device 1000 may recalculate the remaining lifetime as about 67% of the maximum lifetime. The remaining lifetime calculating device 1000 may generate the remaining lifetime code RLC corresponding to the recalculated remaining lifetime (step S1250), and may store the remaining lifetime code RLC in the mode register 130 (step S1260).

Figure 16:
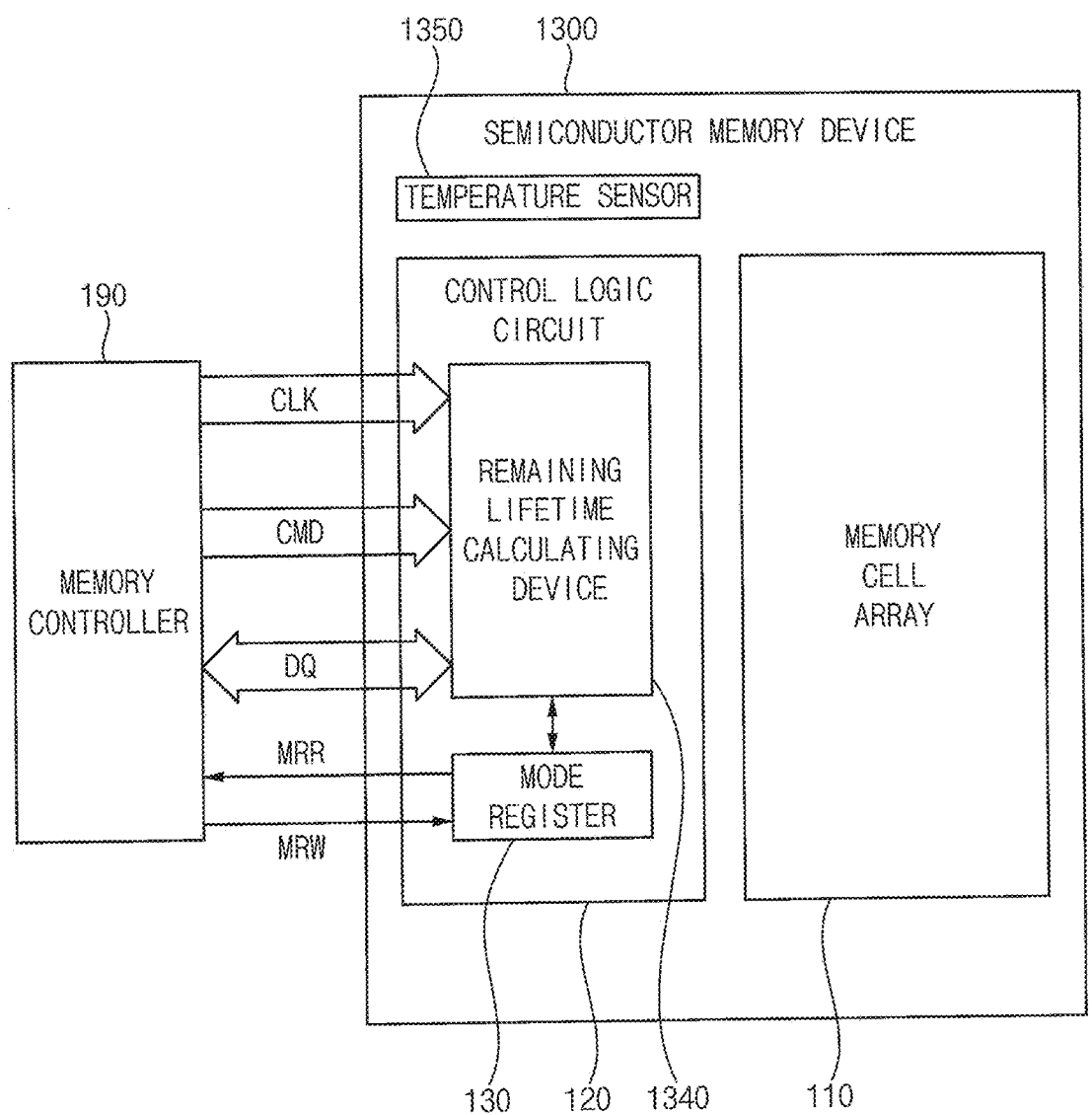
FIG. 16 is a block diagram that illustrates a semiconductor memory device including a temperature sensor according to embodiments.

FIG. 16 is a block diagram that illustrates a semiconductor memory device including a temperature sensor according to embodiments.

Referring to FIG. 16, a semiconductor memory device 1300 may include a memory cell array 110, a control logic circuit 120 and a temperature sensor 1350 that detects a temperature of the semiconductor memory device 1300. The semiconductor memory device 1300 of FIG. 16 may have a similar configuration and a similar operation to a semiconductor memory device 100 of FIG. 1, except that the semiconductor memory device 1300 may further include the temperature sensor 1350, and that a remaining lifetime calculating device 1340 may recalculate a remaining lifetime of the semiconductor memory device 1300 when the temperature detected by the temperature sensor 1350 is changed.

Figure 17:
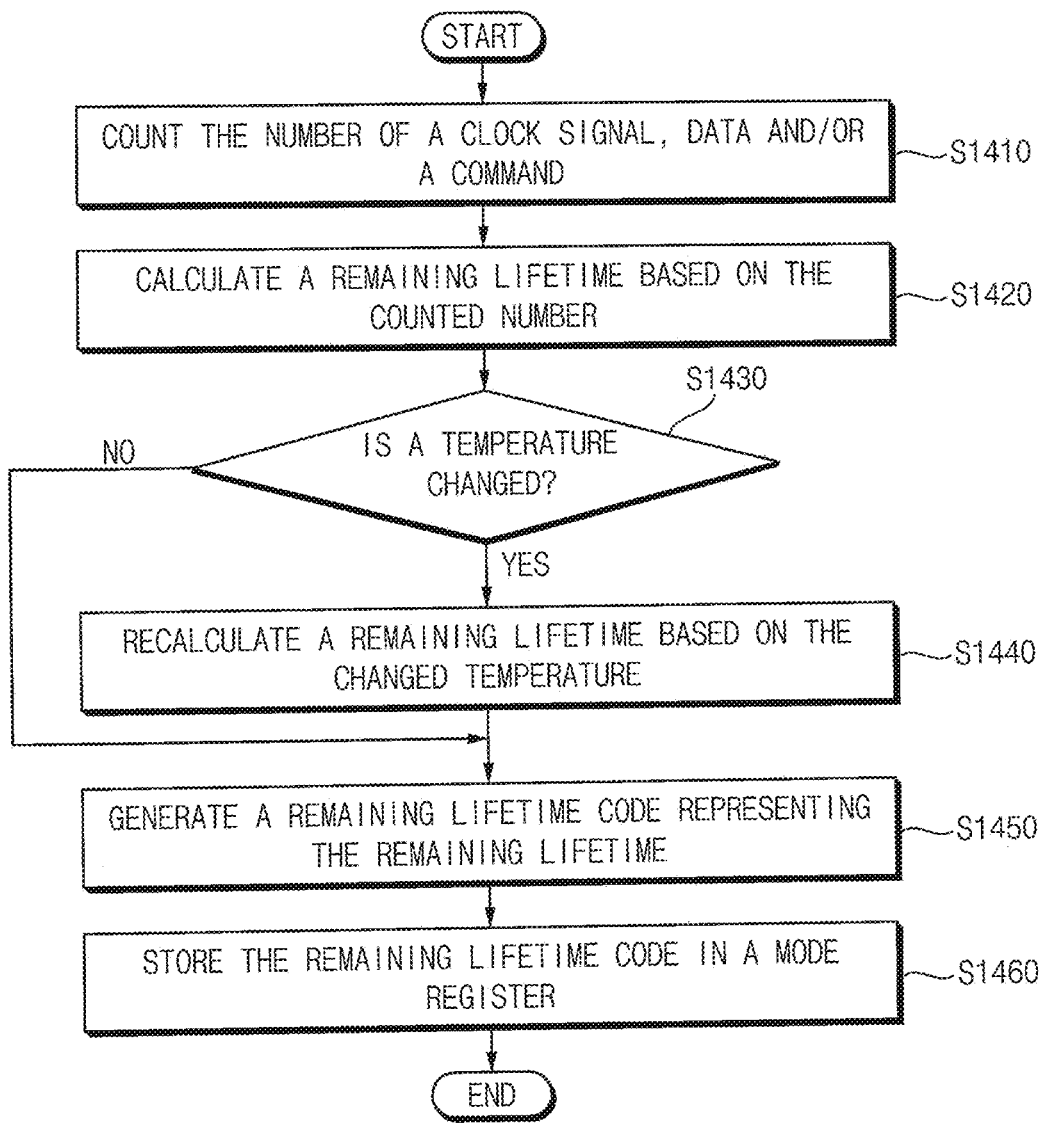
FIG. 17 is a flowchart that illustrates a method of calculating a remaining lifetime of a semiconductor memory device according to embodiments.

FIG. 17 is a flowchart that illustrates a method of calculating a remaining lifetime of a semiconductor memory device according to embodiments.

Referring to FIGS. 16 and 17, a remaining lifetime calculating device 1340 may count the number of a clock signal CLK, data DQ and/or a command CMD (step S1410), and may calculate a remaining lifetime of a semiconductor memory device 1300 based on the counted number(s) (e.g., usage metrics) (step S1420).

A temperature sensor 1350 may detect a temperature of the semiconductor memory device 1300. In a case where the temperature of the semiconductor memory device 1300 is not changed (step S1430: NO), the remaining lifetime calculating device 1340 may generate a remaining lifetime code RLC corresponding to the calculated remaining lifetime calculated from step S1420 (step S1450), and may store the remaining lifetime code RLC in a mode register 130 (step S1460).

In a case where the temperature of the semiconductor memory device 1300 is changed (step S1430: YES), the remaining lifetime calculating device 1340 may recalculate the remaining lifetime of the semiconductor memory device 1300 based on the changed temperature (step S1440). For example, as the temperature of the semiconductor memory device 1300 decreases, the recalculated remaining lifetime may increase. The remaining lifetime calculating device 1340 may generate the remaining lifetime code RLC corresponding to the recalculated remaining lifetime (step S1450), and may store the remaining lifetime code RLC in the mode register 130 (step S1460).

Figure 18:
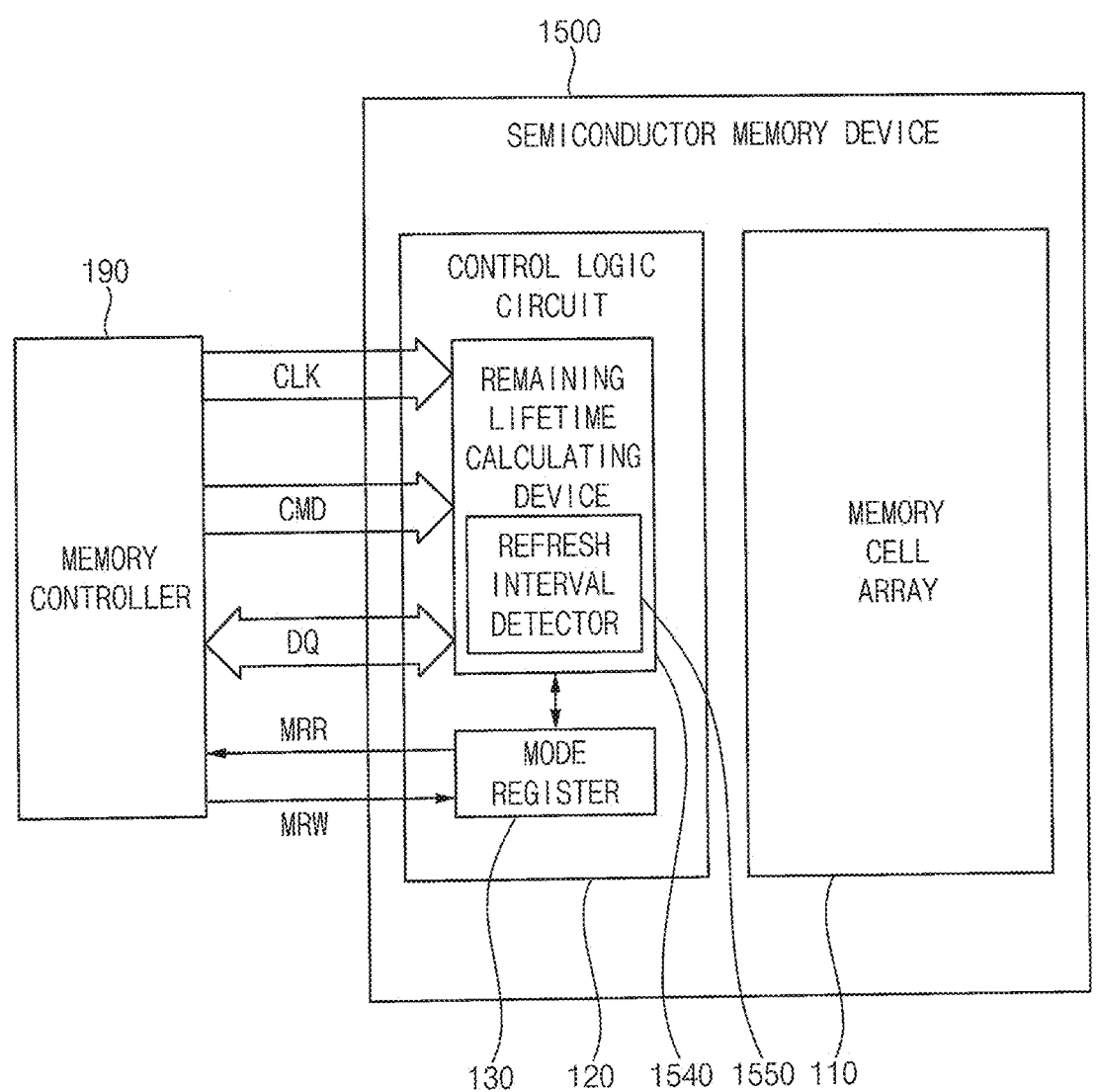
FIG. 18 is a block diagram that illustrates a semiconductor memory device including a refresh interval detector according to embodiments.

FIG. 18 is a block diagram that illustrates a semiconductor memory device including a refresh interval detector according to embodiments.

Referring to FIG. 18, a semiconductor memory device 1500 may include a memory cell array 110 and a control logic circuit 120. A remaining lifetime calculating device 1540 may include a refresh interval detector 1550 that detects an interval between refresh commands received from a memory controller 190. The semiconductor memory device 1500 of FIG. 18 may have a similar configuration and a similar operation to a semiconductor memory device 100 of FIG. 1, except that the remaining lifetime calculating device 1540 may include the refresh interval detector 1550, and may recalculate a remaining lifetime of the semiconductor memory device 1500 when the interval between the refresh commands (e.g. detected by the refresh interval detector 1550) is changed.

Figure 19:
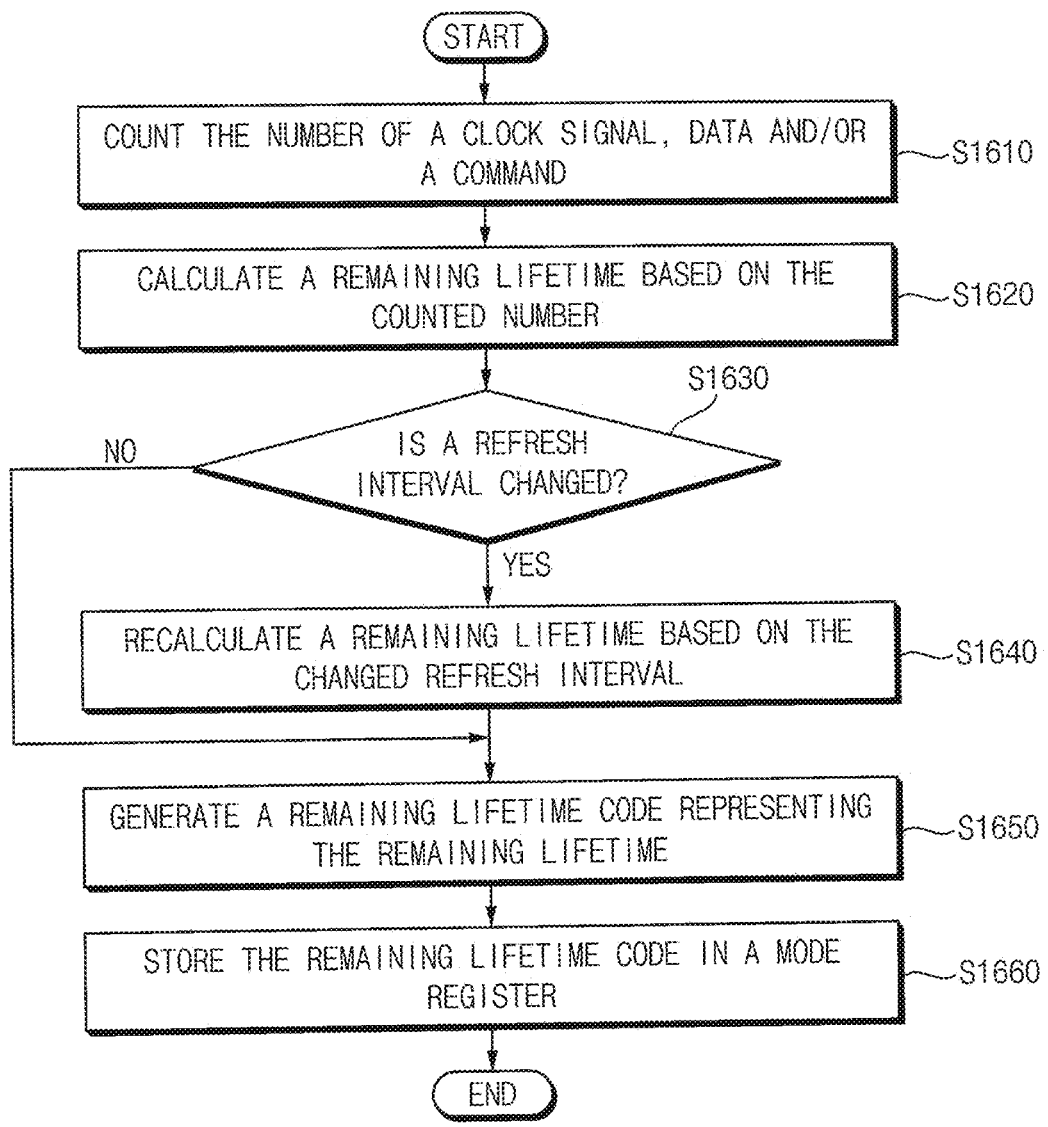
FIG. 19 is a flowchart that illustrates a method of calculating a remaining lifetime of a semiconductor memory device according to embodiments.

FIG. 19 is a flowchart that illustrates a method of calculating a remaining lifetime of a semiconductor memory device according to embodiments.

Referring to FIGS. 18 and 19, a remaining lifetime calculating device 1540 may count the number of a clock signal CLK, data DQ and/or a command CMD (step S1610), and may calculate a remaining lifetime of a semiconductor memory device 1500 based on the counted numb er(s) (e.g., usage metrics) (step S1620).

A refresh interval detector 1550 may detect an interval between refresh commands received from a memory controller 190, referred to as a refresh interval. In a case where the refresh interval is not changed (step S1630: NO), the remaining lifetime calculating device 1540 may generate a remaining lifetime code RLC corresponding to the calculated remaining lifetime calculated from step S1620 (step S1650), and may store the remaining lifetime code RLC in a mode register 130 (step S1660).

In a case where the refresh interval is changed (step S1630: YES), the remaining lifetime calculating device 1540 may recalculate the remaining lifetime of the semiconductor memory device 1500 based on the changed refresh interval (step S1640). For example, as the refresh interval of the semiconductor memory device 1500 decreases, the recalculated remaining lifetime may increase. The remaining lifetime calculating device 1540 may generate the remaining lifetime code RLC corresponding to the recalculated remaining lifetime (step S1650), and may store the remaining lifetime code RLC in the mode register 130 (step S1660).

Figure 20:
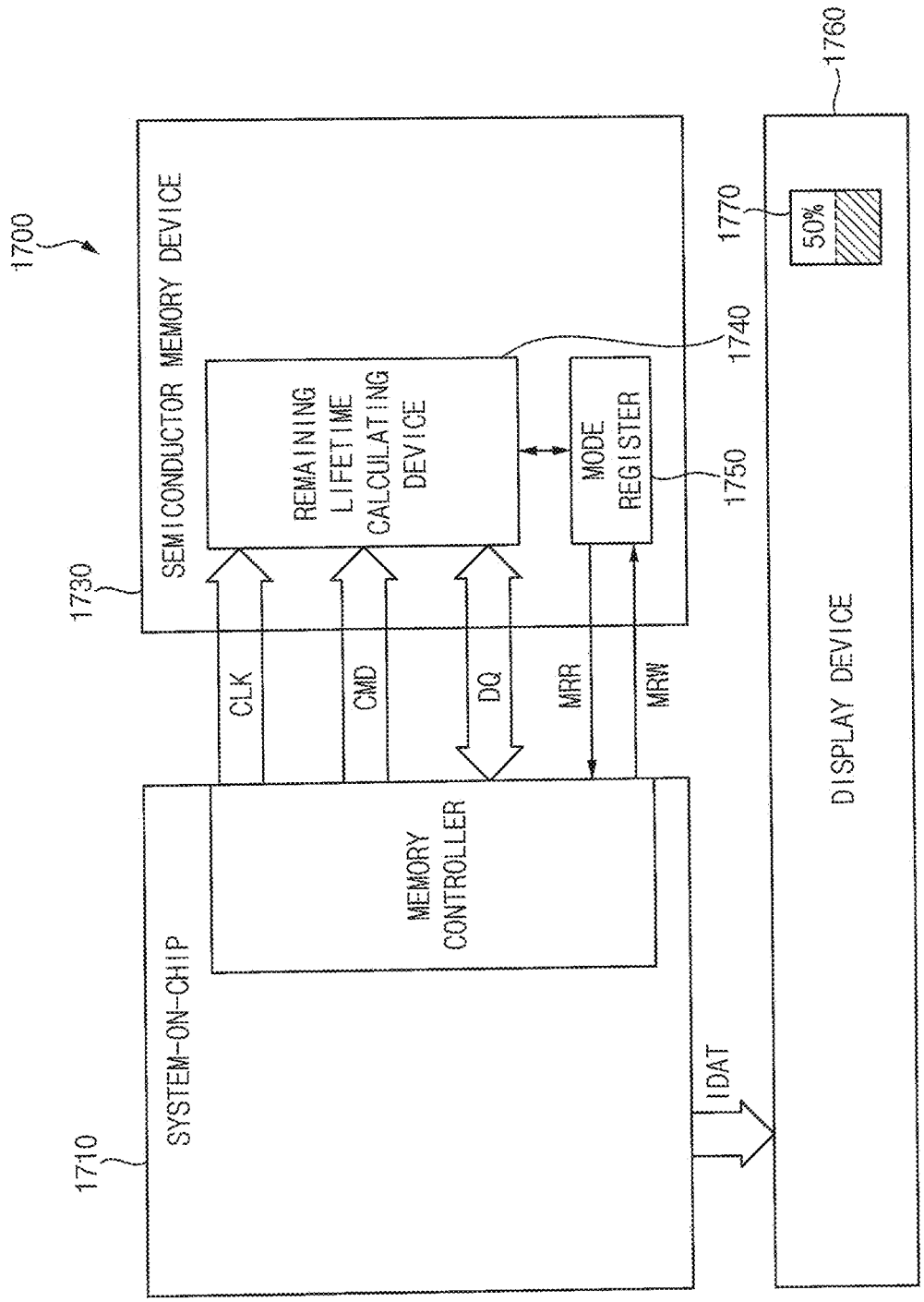
FIG. 20 is a block diagram that illustrates a memory system including a semiconductor memory device according to embodiments.
Figure 21:
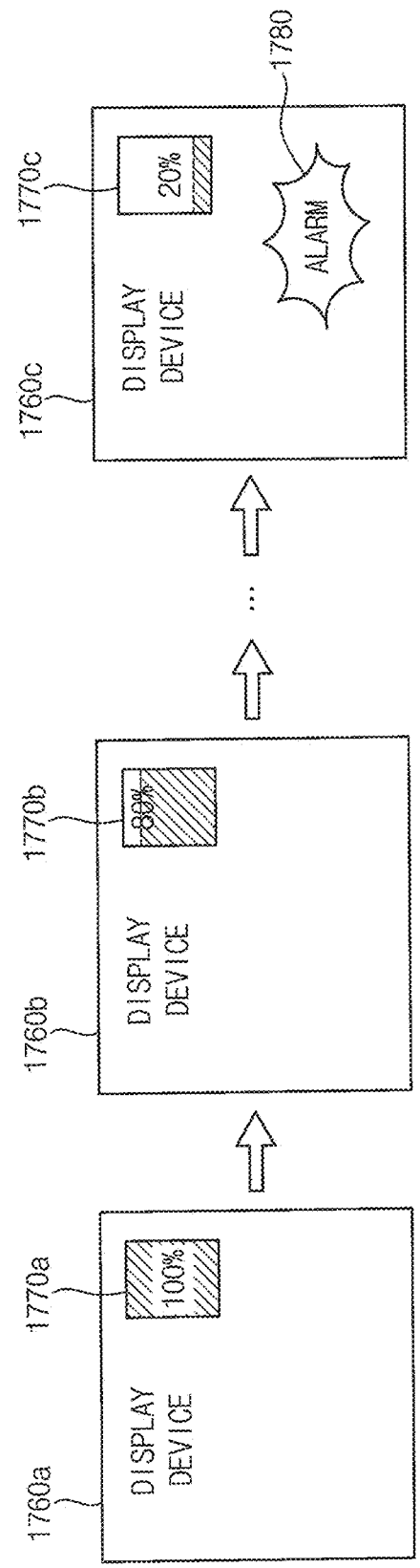
FIG. 21 is a diagram that illustrates an example where a remaining lifetime of a semiconductor memory device is displayed in a memory system according to embodiments.

FIG. 20 is a block diagram that illustrates a memory system including a semiconductor memory device according to embodiments, and FIG. 21 is a diagram that illustrates an example where a remaining lifetime of a semiconductor memory device is displayed in a memory system according to embodiments.

Referring to FIG. 20, a memory system 1700 may include a system-on-chip 1710, a semiconductor memory device 1730 and a display device 1760. The memory system 1700 may be any computing system. For example, the memory system 1700 may be, but not limited to, a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a computing system used for navigation, a wearable device, an internet of things (IoT) device, an internet of everything (IoE) device, an e-book reader, a virtual reality (VR) device, an augmented reality (AR) device, a robotic device, a drone, an autonomous driving assistant computing system, etc.

The system-on-chip 1710 may control an overall operation of the memory system 1700. The system-on-chip 1710 may include a memory controller 1720 that outputs a clock signal CLK and a command CMD, and inputs or outputs data DQ.

The semiconductor memory device 1730 may receive the clock signal CLK and the command CMD from the memory controller 1720, may transmit or receive the data DQ to or from the memory controller 1720, may count the number of the clock signal CLK, the data DQ, and/or the command CMD, may generate a remaining lifetime code representing a remaining lifetime of the semiconductor memory device 1730 based on the counted number(s) (e.g., usage metrics), and may store the remaining lifetime code in a mode register 1750. The semiconductor memory device 1730 may include a remaining lifetime calculating device 1740 that generates the remaining lifetime code representing the remaining lifetime of the semiconductor memory device 1730. For example, the remaining lifetime calculating device 1740 may be a remaining lifetime calculating device 300 of FIG. 3, a remaining lifetime calculating device 500 of FIG. 6, a remaining lifetime calculating device 700 of FIG. 8, a remaining lifetime calculating device 1000 of FIG. 11, or a remaining lifetime calculating device that implements portions of the aforementioned remaining lifetime calculating devices. In some embodiments, the memory controller 1720 stores parameter setting information representing a parameter used to determine the remaining lifetime of the semiconductor memory device in the mode register 1750 by performing a mode register write operation MRW, and the remaining lifetime calculating device 1740 may select a clock number of the clock signal CLK, a data number of the data DQ, and/or a command number of the command CMD based on the parameter setting information stored in the mode register 1750, and may generate the remaining lifetime code based on the selected one or more of the clock number, the data number and the command number.

The display device 1760 may display an image 1770 including the remaining lifetime of the semiconductor memory device 1730 represented by the remaining lifetime code. In some embodiments, the memory controller 1720 receives the remaining lifetime code stored in the mode register 1750 from the semiconductor memory device 1730 by performing a mode register read operation MRR, and the system-on-chip 1710 may transfer image data IDAT for the remaining lifetime of the semiconductor memory device 1730 represented by the remaining lifetime code to the display device 1760. The display device 1760 may display the image 1770 including the remaining lifetime of the semiconductor memory device 1730 based on the image data IDAT.

In some embodiments, when the remaining lifetime represented by the remaining lifetime code becomes lower than or equal to a reference remaining lifetime, the system-on-chip 1710 outputs an alarm in image and/or sound by using the display device 1260 and/or another device. For example, as illustrated in FIG. 21, in a case where the remaining lifetime represented by the remaining lifetime code is about 100% of a maximum lifetime of the semiconductor memory device 1730, the display device 1760a may display an image 1770a representing the remaining lifetime of about 100%. In a case where the remaining lifetime represented by the remaining lifetime code is about 80% of the maximum lifetime, the display device 1760b may display an image 1770b representing the remaining lifetime of about 80%. If the remaining lifetime represented by the remaining lifetime code becomes lower than or equal to the reference remaining lifetime, for example if the remaining lifetime is about 20% of the maximum lifetime, the display device 1760c may display an alarm image 1780 in addition to an image 1770c representing the remaining lifetime of about 20%. Thus, a system manager may check the remaining lifetime of the semiconductor memory device 1730 in real time, and manager may replace the semiconductor memory device 1730 before a lifetime of the semiconductor memory device 1730 is exhausted. Accordingly, a system error caused by lifetime exhaustion of the semiconductor memory device 1730 may be prevented.

The inventive concept may be applied to various electronic devices and systems that include semiconductor memory devices. For example, the inventive concept may be applied to systems such as a PC, a server computer, a data center, a workstation, a mobile phone, a smart phone, a tablet computer, a laptop computer, a PDA, a PMP, a digital camera, a portable game console, a music player, a camcorder, a video player, a navigation device, a wearable device, an IoT device, an IoE device, an e-book reader, a VR device, an AR device, a robotic device, a drone, a driver-assisting computing system, an autonomous vehicle computing system, etc.

The foregoing is illustrative of embodiments and is not to be construed as limiting thereof. Although some exemplary embodiments have been described, those skilled in the art will readily appreciate that many modifications may be made to the embodiments without materially departing from the novel teachings and advantages of the embodiments. For example, aside from the counted numbers, measured temperatures, refresh rates, and other metrics provided herein, one modification may implement another usage metric to predict or calculate a remaining lifetime of a semiconductor device, and display it to allow a user to prevent a system error.

Accordingly, all such modifications are intended to be included within the scope of the embodiments as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An autonomous vehicle computing system comprising:
   a controller configured to output a clock signal and a command, and configured to input or output data;
   a memory device configured to:
      receive the clock signal and the command;
      transmit or receive the data;
      measure a number of at least one of the clock signal, the data and the command; and
      generate a remaining lifetime value representing a remaining lifetime of the memory device based on the measured number; and
   a display device configured to display the remaining lifetime represented by the remaining lifetime value.

2. The autonomous vehicle computing system of claim 1, wherein the memory device recalculates the remaining lifetime value when a parameter related to the remaining lifetime changes, and stores the recalculated remaining lifetime value in a mode register of the memory device, and
   wherein the display device read the recalculated remaining lifetime value from the mode register of the memory device, and displays the remaining lifetime represented by the recalculated remaining lifetime value.

3. The autonomous vehicle computing system of claim 2, wherein the memory device includes a temperature sensor configured to detect a temperature, and recalculates the remaining lifetime value when the temperature changes.

4. The autonomous vehicle computing system of claim 2, wherein the memory device includes a refresh interval detector configured to detect an interval between refresh commands, and recalculates the remaining lifetime value when the interval changes.

5. The autonomous vehicle computing system of claim 2, wherein the memory device includes a clock monitor configured to monitor a clock speed of the clock signal, and recalculates the remaining lifetime value when the clock speed changes.

6. The autonomous vehicle computing system of claim 1, wherein the memory device includes a mode register configured to store the remaining lifetime value, and
   wherein the remaining lifetime value stored in the mode register has a first value representing that the remaining lifetime is a maximum lifetime, a second value representing that no remaining lifetime exists, or a value between the first value and the second value representing a ratio of the remaining lifetime to the maximum lifetime.

7. The autonomous vehicle computing system of claim 1, wherein, when the remaining lifetime represented by the remaining lifetime value becomes lower than or equal to a reference remaining lifetime, the controller outputs an alarm by using the display device and/or another output device.

8. The autonomous vehicle computing system of claim 1, wherein the memory device recalculates the remaining lifetime when a parameter related to the remaining lifetime changes, and
   wherein, when the recalculated remaining lifetime becomes lower than or equal to a reference remaining lifetime, the controller outputs an alarm by using the display device and/or another output device.

9. The autonomous vehicle computing system of claim 1, wherein the memory device includes:
   a remaining lifetime calculating device configured to count usage metrics based on one or more of the following:
   a number of clock signals received from the controller,
   an amount of data transmitted or received to or from the controller, and/or
   a number of commands received from the controller.

10. A method of representing a remaining lifetime of a memory device in an autonomous vehicle computing system, the method comprising:
   displaying the remaining lifetime of the memory device on a display device received from the memory device,
   wherein the remaining lifetime of the memory device is generated in the memory device based on a measured number of at least one of a clock signal, input data, out data and a command.

11. The method of claim 10, further comprising:
   recalculating the remaining lifetime when a parameter related to the remaining lifetime changes;
   storing a remaining lifetime value representing the recalculated remaining lifetime in a mode register of the memory device;
   reading the remaining lifetime value from the mode register of the memory device; and
   displaying the remaining lifetime based on the read remaining lifetime value.

12. The method of claim 10, wherein the memory device includes a mode register configured to store a remaining lifetime value representing the remaining lifetime of the memory device, and
   wherein the remaining lifetime value stored in the mode register has a first value representing that the remaining lifetime is a maximum lifetime, a second value representing that no remaining lifetime exists, or a value between the first value and the second value representing a ratio of the remaining lifetime to the maximum lifetime.

13. The method of claim 10, further comprising:
   outputting an alarm by using the display device and/or another output device when the remaining lifetime becomes lower than or equal to a reference remaining lifetime value.

14. The method of claim 10, further comprising:
   recalculating the remaining lifetime when a parameter related to the remaining lifetime changes; and
   outputting an alarm by using the display device and/or another output device when the recalculated remaining lifetime becomes lower than or equal to a reference remaining lifetime.

15. The method of claim 10, further comprising:
   counting usage metrics based on one or more of the following:
   a number of clock signals received from the controller,
   an amount of data transmitted or received to or from the controller, and/or
   a number of commands received from the controller.

16. An autonomous vehicle computing system comprising:
   a controller configured to output a clock signal and a command, and configured to input or output data;
   a memory device configured to:
      receive the clock signal and the command;
      transmit or receive the data;
      measure a number of at least one of the clock signal, the data and the command; and generate a remaining lifetime value representing a remaining lifetime of the memory device based on the measured number; and a display device configured to display the remaining lifetime represented by the remaining lifetime value, wherein the memory device includes a mode register that stores parameter setting information including a parameter used to determine the remaining lifetime of the memory device.

17. The autonomous vehicle computing system of claim 16, wherein the memory device selects a clock number of the clock signal, a data number of the data, and/or a command number of the command based on the parameter setting information stored in the mode register to generate the remaining lifetime value.

18. The autonomous vehicle computing system of claim 16, wherein four bits of the mode register store the parameter setting information.

19. The autonomous vehicle computing system of claim 18, wherein a first bit of the mode register indicates whether the clock signal is used in calculating the remaining lifetime, wherein a second bit of the mode register indicates whether the data is used in calculating the remaining lifetime, wherein a third bit of the mode register indicates whether read and write commands are used in calculating the remaining lifetime, and wherein a fourth bit of the mode register indicates whether a refresh command is used in calculating the remaining lifetime.

20. The autonomous vehicle computing system of claim 18, wherein, when the four bits of the mode register store a value of '0001', the memory device uses the clock signal in calculating the remaining lifetime, wherein, when the four bits of the mode register store a value of '0010', the memory device uses the data in calculating the remaining lifetime, wherein, when the four bits of the mode register store a value of '0100', the memory device uses read and write commands in calculating the remaining lifetime, wherein, when the four bits of the mode register store a value of '1000', the memory device uses a refresh command in calculating the remaining lifetime, and wherein, when the four bits of the mode register store a value of '1111', the memory device uses all of the clock signal, the data, the read and write commands and the refresh command in calculating the remaining lifetime.

* * * * *